United States Patent
Kim et al.

(10) Patent No.: US 12,310,075 B2
(45) Date of Patent: May 20, 2025

(54) INTEGRATED CIRCUIT DEVICES INCLUDING VERTICALLY STACKED FIELD EFFECT TRANSISTORS

(71) Applicant: Samsung Electronics Co., Ltd., Suwon-si (KR)

(72) Inventors: Dohee Kim, Seoul (KR); Sunguk Jang, Hwaseong-si (KR); Bongjin Kuh, Suwon-si (KR); Kongsoo Lee, Hwaseong-si (KR); Sahwan Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 497 days.

(21) Appl. No.: 17/720,880

(22) Filed: Apr. 14, 2022

(65) Prior Publication Data
US 2023/0076270 A1 Mar. 9, 2023

(30) Foreign Application Priority Data
Sep. 9, 2021 (KR) ................. 10-2021-0120545

(51) Int. Cl.
*H10D 62/10* (2025.01)
*H10D 30/67* (2025.01)
*H10D 84/83* (2025.01)

(52) U.S. Cl.
CPC ....... *H10D 62/118* (2025.01); *H10D 30/6713* (2025.01); *H10D 30/6757* (2025.01); *H10D 84/834* (2025.01)

(58) Field of Classification Search
None
See application file for complete search history.

(56) References Cited

U.S. PATENT DOCUMENTS

| | | | |
|---|---|---|---|
| 8,637,849 B2 | 1/2014 | Deligianni et al. | |
| 9,875,945 B2 | 1/2018 | Anderson et al. | |
| 10,388,648 B2 | 8/2019 | Balakrishnan et al. | |
| 10,770,479 B2 | 9/2020 | Smith et al. | |
| 11,004,856 B1 | 5/2021 | Zhang et al. | |
| 11,038,042 B2 | 6/2021 | Loubet | |
| 2005/0248035 A1* | 11/2005 | Son | H01L 27/0688 257/E21.627 |
| 2006/0237725 A1* | 10/2006 | Jeong | H10D 88/00 257/69 |
| 2020/0219970 A1* | 7/2020 | Mannebach | H01L 29/66439 |
| 2020/0365586 A1* | 11/2020 | Shin | H01L 29/775 |
| 2021/0091080 A1 | 3/2021 | Dewey et al. | |
| 2021/0118951 A1 | 4/2021 | Reznicek et al. | |
| 2021/0210349 A1* | 7/2021 | Xie | H01L 21/76224 |
| 2023/0052477 A1* | 2/2023 | Ha | H01L 29/66439 |

* cited by examiner

*Primary Examiner* — Daniel Whalen
(74) *Attorney, Agent, or Firm* — Myers Bigel, P.A.

(57) ABSTRACT

An integrated circuit device includes: an active region extending in a first horizontal direction on a substrate; a first transistor at a first vertical level on the active region, the first transistor including a first source/drain region having a first conductive type; and a second transistor at a second vertical level that is higher than the first vertical level on the active region, the second transistor including a second source/drain region having a second conductive type and overlapping the first source/drain region in a vertical direction, wherein the first source/drain region and the second source/drain region have different sizes.

19 Claims, 27 Drawing Sheets

INTEGRATED CIRCUIT DEVICES INCLUDING VERTICALLY STACKED FIELD EFFECT TRANSISTORS

CROSS-REFERENCE TO RELATED APPLICATION

This application is based on and claims priority under 35 U.S.C. § 119 to Korean Patent Application No. 10-2021-0120545, filed on Sep. 9, 2021, in the Korean Intellectual Property Office, the disclosure of which is incorporated by reference herein in its entirety.

BACKGROUND

The present disclosure relates to an integrated circuit device, and more particularly, to an integrated circuit device including vertically stacked field effect transistors.

Recently, as the down-scaling of integrated circuit devices has been rapidly done, two-dimensional circuits may be used where n-channel metal oxide semiconductor (NMOS) and p-channel metal oxide semiconductor (PMOS) field effect transistors having a gate all around (GAA) structure are horizontally disposed. However, there is a limitation in increasing the number of transistors per unit area. Therefore, it is desired to develop new technology for enhancing the electrical performance of each of NMOS and PMOS field effect transistors and further increasing the number of transistors per unit area to further increase the degree of integration.

SUMMARY

The present disclosure provides an integrated circuit device having a structure which improves the electrical performance of each of NMOS and PMOS field effect transistors and further increases the number of transistors per unit area to further increase the degree of integration. The integrated circuit device includes a device region having an area reduced based on down-scaling.

According to an aspect of the present disclosure, there is provided an integrated circuit device that comprises a active region extending in a first horizontal direction on a substrate; a first transistor at a first vertical level on the active region, the first transistor comprising a first source/drain region having a first conductive type; and a second transistor at a second vertical level that is higher than the first vertical level on the active region, the second transistor comprising a second source/drain region having a second conductive type and overlapping the first source/drain region in a vertical direction, wherein the first source/drain region and the second source/drain region have different sizes.

According to another aspect of the present disclosure, there is provided an integrated circuit device that comprises a fin-type active region protruding in a vertical direction from a substrate and extending in a first horizontal direction; at least one first nano-sheet at a first separation distance in the vertical direction from a top of the fin-type active region; a plurality of first source/drain regions at both sides of the at least one first nano-sheet, the plurality of first source/drain regions including a semiconductor material having a first conductive type; at least one second nano-sheet at a second separation distance that is greater than the first separation distance in the vertical direction from the top of the fin-type active region and overlapping the at least one first nano-sheet in the vertical direction; a plurality of second source/drain regions at both sides of the at least one second nano-sheet and overlapping the plurality of first source/drain regions in the vertical direction, the plurality of second source/drain regions including a semiconductor material having a second conductive type; and a gate line surrounding the at least one first nano-sheet and the at least one second nano-sheet, wherein a size of at least one of the plurality of first source/drain regions differs from a size of at least one of the plurality of second source/drain regions.

According to another aspect of the present disclosure, there is provided an integrated circuit device that comprises a fin-type active region extending in a first horizontal direction on a substrate; a first transistor at a first vertical level on the fin-type active region; a second transistor at a second vertical level that is higher than the first vertical level on the fin-type active region; and a gate line shared by the first transistor and the second transistor, wherein the first transistor comprises at least one first nano-sheet at a first separation distance in a vertical direction from a top of the fin-type active region and surrounded by the gate line and a first source/drain region contacting the at least one first nano-sheet, wherein the first source/drain region comprises an n-type semiconductor material, and wherein the second transistor comprises at least one second nano-sheet at a second separation distance that is greater than the first separation distance in the vertical direction from the top of the fin-type active region, wherein the at least one second nano-sheet overlaps the at least one first nano-sheet in the vertical direction and is surrounded by the gate line and a second source/drain region contacting the at least one second nano-sheet and having a size greater than a size of the first source/drain region, wherein the second source/drain region comprises a p-type semiconductor material.

BRIEF DESCRIPTION OF THE DRAWINGS

Embodiments of the present disclosure will be more clearly understood from the following detailed description taken in conjunction with the accompanying drawings in which:

FIGS. 4A to 16B are cross-sectional views illustrating a process sequence of a method of manufacturing an integrated circuit device, according to certain embodiments. FIGS. 4A, 5A, 6 to 12, 13A, 14A, 15A, and 16A are cross-sectional views based on a process sequence in a cross-sectional surface taken along line X1-X1' of FIG. 1, and FIGS. 4B, 5B, 13B, 14B, 15B, and 16B are cross-sectional views based on a process sequence in a cross-sectional surface taken along line Y1-Y1' of FIG. 1.

DETAILED DESCRIPTION OF THE EMBODIMENTS

Hereinafter, embodiments will be described in detail with reference to the accompanying drawings. Like numeral references refer to like elements, and their repetitive descriptions are omitted.

Figure 1:
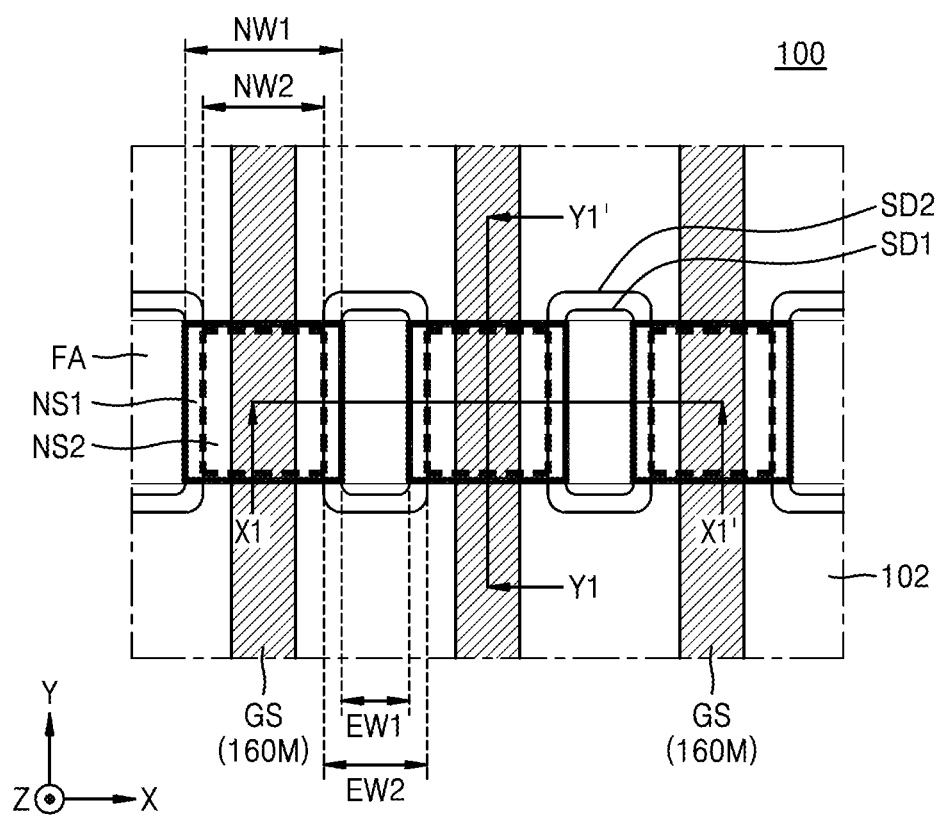
FIG. 1 is a plane layout diagram of some elements of an integrated circuit device according to some embodiments.
Figure 2A:
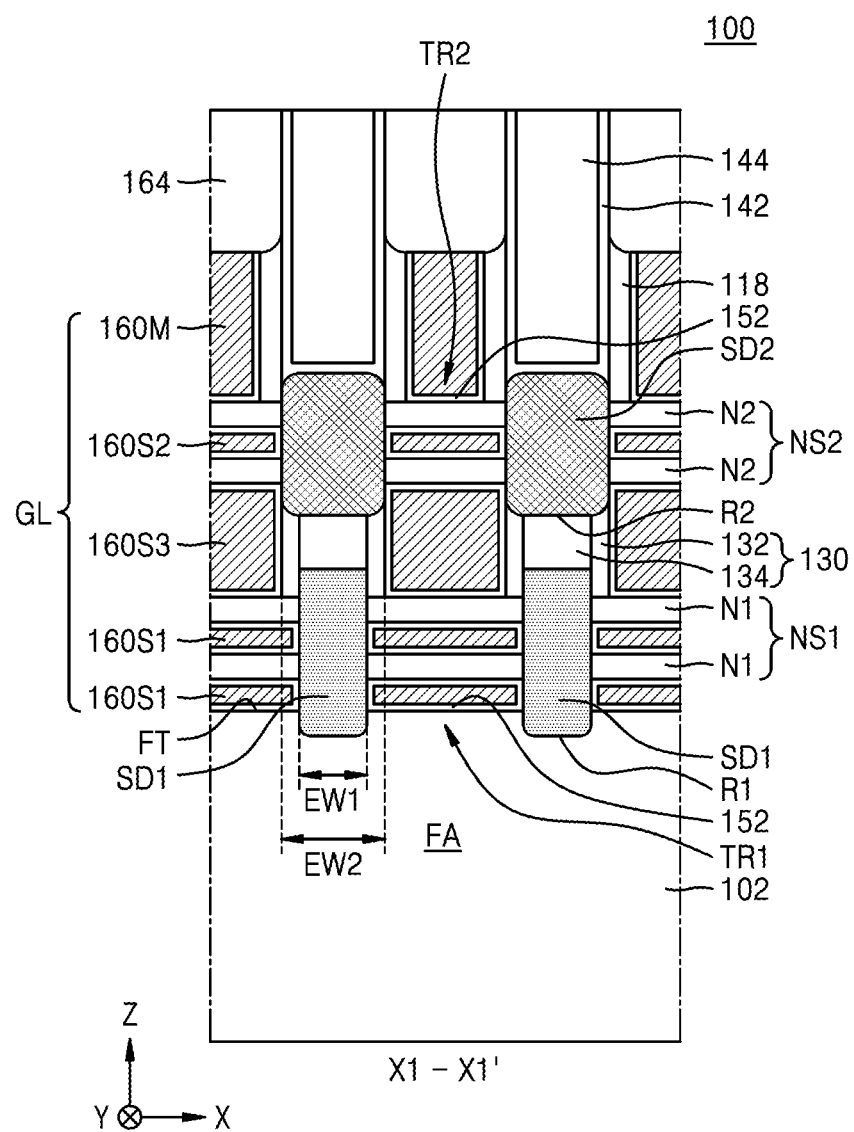
FIG. 2A is a cross-sectional view taken along line X1-X1' of FIG. 1.

FIG. 1 is a plane layout diagram of some elements of an integrated circuit device 100 according to certain embodiments. FIG. 2A is a cross-sectional view taken along line X1-X1' of FIG. 1, and FIG. 2B is a cross-sectional view taken along line Y1-Y1' of FIG. 1.

Figure 2B:
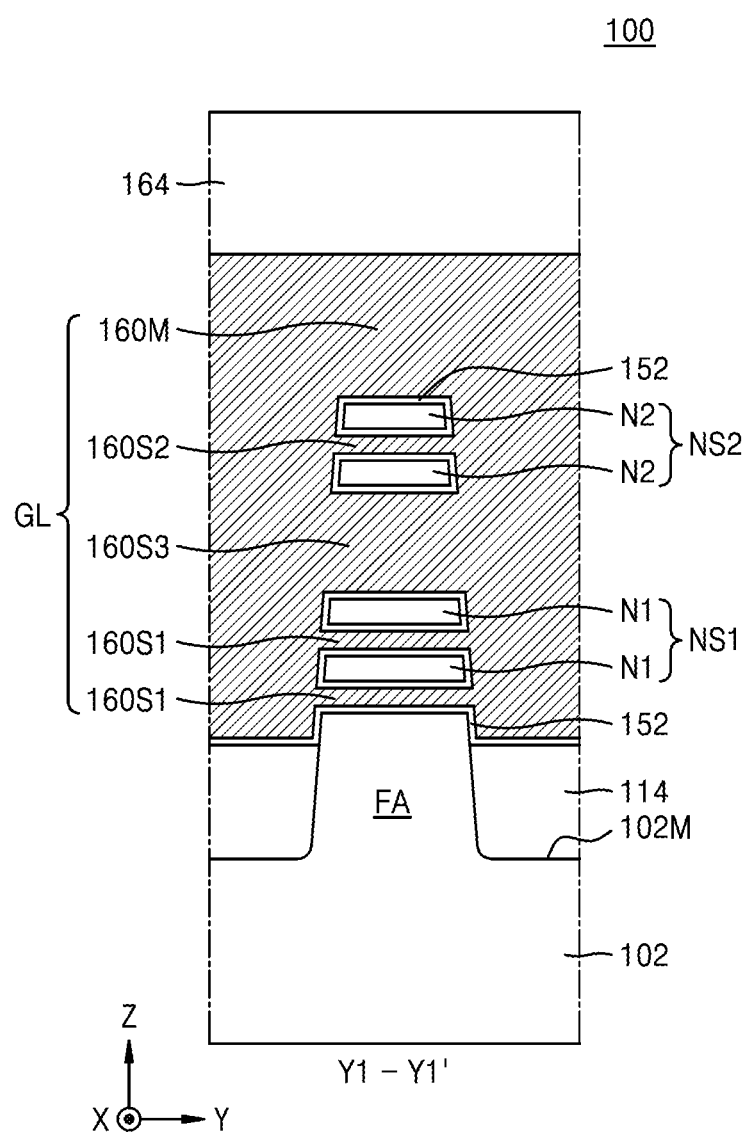
FIG. 2B is a cross-sectional view taken along line Y1-Y1' of FIG. 1.

Referring to FIGS. 1, 2A, and 2B, the integrated circuit device 100 may include: a plurality of fin-type active regions FA which protrude in a vertical direction (a Z direction) and extend a first length in a first horizontal direction (an X direction) from a substrate 102; a first transistor TR1 at a first vertical level on each of the fin-type active regions FA; and a second transistor TR2 at a second vertical level that is higher than the first vertical level on each of the fin-type active regions FA. The first transistor TR1 may overlap the second transistor TR2 in the vertical direction (the Z direction). As used herein, when element A is said to "overlap" or is "overlapping" element B, it may refer to the situation where element A is said to extend over or past, and cover a part of, element B in a given direction. Note that element A may overlap element B in a first direction, but may or may not overlap element B in a second direction.

The substrate 102 may include a semiconductor, such as silicon (Si) or germanium (Ge), or a compound semiconductor such as SiGe, Silicon Carbide (SiC), Gallium Arsenide (GaAs), Indium Arsenide (InAs), Indium Gallium Arsenide (InGaAs), or Indium Phosphide (InP). The terms "SiGe", "SiC", "GaAs", "InAs", "InGaAs", and "InP" used herein may each denote a material including elements included therein and may not be a chemical formula representing a stoichiometric relationship.

A plurality of nano-sheets N1 and N2 providing channel regions of the first transistor TR1 and the second transistor TR2 may be on the fin-type active region FA. The term "nano-sheet" used herein may denote a conductive structure which includes a cross-sectional surface substantially vertical to a direction in which a current flows. It may be understood that the nano-sheet includes a nanowire.

The first transistor TR1 may include a first nano-sheet stack NS1, including a plurality of first nano-sheets N1 on a fin top FT of the fin-type active region FA, and a plurality of first source/drain regions SD1, which are disposed at both sides of the first nano-sheet stack NS1 and respectively contact the plurality of first nano-sheets N1. In one embodiment, the plurality of first source/drain regions SD1 may be a pair of first source/drain regions SD1, but the present disclosure is not limited to this number or arrangement. Each of the plurality of first source/drain regions SD1 of the first transistor TR1 may partially or completely fill a first recess R1 formed in the fin-type active region FA. A lowermost surface level of the first recess R1 may be lower than the fin top FT of the fin-type active region FA. The term "level" used herein may denote a distance in a vertical direction (a Z direction or −Z direction) from a top surface of the substrate 102. The term "lower" as used herein may refer to an element A that is at a level that is nearer to a top surface of the substrate 102 in a vertical direction (a Z direction or −Z direction) than a respective element B, whereas the term "higher" as used herein may refer to an element A that is at a level that is further from a top surface of the substrate 102 in a vertical direction (a Z direction or −Z direction) than a respective element B. The first nano-sheet stack NS1 may be disposed at a first separation distance upward in the vertical direction (the Z direction) from the fin top FT of the fin-type active region FA.

The second transistor TR2 may include a second nano-sheet stack NS2, including a plurality of second nano-sheets N2 disposed at a second separation distance that is greater than the first separation distance upward in the vertical direction (the Z direction) from the fin top FT of the fin-type active region FA, and a plurality of second source/drain regions SD2, which are disposed at both sides of the second nano-sheet stack NS2 and respectively contact the plurality of second nano-sheets N2. In one embodiment, the plurality of second source/drain regions SD2 may be a pair of second source/drain regions SD2, but the present disclosure is not limited to this number or arrangement. The second nano-sheet stack NS2 may be apart from the fin top FT of the fin-type active region FA in the vertical direction (the Z direction) with the first nano-sheet stack NS1 therebetween. Each of the plurality of second source/drain regions SD2 may overlap a corresponding one of the plurality of first source/drain region SD1 in the vertical direction (the Z direction). Each of the plurality of second source/drain regions SD2 may be apart from the fin-type active region FA in the vertical direction (the Z direction) with a corresponding one of the plurality of first source/drain region SD1 therebetween.

A minimum separation distance between the first nano-sheet stack NS1 and the second nano-sheet stack NS2 in the vertical direction (the Z direction) may be greater than a minimum separation distance between adjacent ones of the plurality of first nano-sheets N1 included in the first nano-sheet stack NS1. A minimum separation distance between the first nano-sheet stack NS1 and the second nano-sheet stack NS2 in the vertical direction (the Z direction) may be greater than a minimum separation distance between adjacent ones of the plurality of second nano-sheets N2 included in the second nano-sheet stack NS2.

The first source/drain region SD1 and the second source/drain region SD2 may have different sizes. As used herein, element A and element B may be said to have different sizes if element A and element B have different widths, different lengths, different heights, and/or different thicknesses. In some embodiments, in a plane (an X-Y plane in FIG. 1) parallel to a main surface 102M of the substrate 102, a plane size of the second source/drain region SD2 may be greater than that of the first source/drain region SD1. In some embodiments, as illustrated in FIGS. 1 and 2A, a maximum width EW2 of the second source/drain region SD2 may be greater than a maximum width EW1 of the first source/drain region SD1 in the first horizontal direction (the X direction). Each of the first source/drain region SD1 and the second source/drain region SD2 may include an epitaxially grown semiconductor layer. In some embodiments, each of the first source/drain region SD1 and the second source/drain region SD2 may include a Group IV element semiconductor, a Group IV-IV compound semiconductor, or a combination thereof.

In some embodiments, the first transistor TR1 may include an n-channel metal oxide semiconductor (NMOS) field effect transistor. The first source/drain region SD1 included in the first transistor TR1 may include a semiconductor layer doped with an n-type dopant. For example, the first source/drain region SD1 may include a Si layer doped with an n-type dopant or a SiC layer doped with an n-type dopant. The n-type dopant may be selected from among phosphorus (P), arsenic (As), and antimony (Sb).

In some embodiments, the second transistor TR2 may include a p-channel metal oxide semiconductor (PMOS) field effect transistor. The second source/drain region SD2 included in the second transistor TR2 may include a semiconductor layer doped with a p-type dopant. For example, the second source/drain region SD2 may include a SiGe layer doped with a p-type dopant. The p-type dopant may be selected from among boron (B) and gallium (Ga).

As illustrated in FIG. 2B, an isolation layer 114 covering both sidewalls of the fin-type active region FA may be disposed on the main surface 102M of the substrate 102. The isolation layer 114 may include oxide, nitride, or a combination thereof.

As illustrated in FIG. 2A, an insulation pattern 130 may be between the first source/drain region SD1 and the second source/drain region SD2. The first source/drain region SD1 and the second source/drain region SD2 may be apart from each other in the vertical direction (the Z direction) with the insulation pattern 130 therebetween. In some embodiments, the insulation pattern 130 may include a double-layer structure which includes a first insulation pattern 132 and a second insulation pattern 134, wherein the first insulation pattern 132 and the second insulation pattern 134 include at least one different material from each other. Each of the first insulation pattern 132 and the second insulation pattern 134 may include silicon nitride (SiN), silicon oxide (SiO), SiCN, SiBN, SiON, SiOCN, SiBCN, SiOC, or a combination thereof. The terms "SiN", "SiO", "SiCN", "SiBN", "SiON", "SiOCN", "SiBCN", and "SiOC" used herein may each denote a material including elements included therein and may not be a chemical formula representing a stoichiometric relationship. In some embodiments, a dielectric constant of the first insulation pattern 132 may be less than that of the second insulation pattern 134. For example, the first insulation layer 132 may include a silicon nitride layer, a SiCN layer, a SiON layer, or a SiOCN layer, and the second insulation layer 134 may include a silicon oxide layer. However, a material of each of the first insulation pattern 132 and the second insulation pattern 134 is not limited to the above description.

Each of the plurality of second source/drain regions SD2 of the second transistor TR2 may partially or completely fill a second recess R2 formed in the insulation pattern 130. A lowermost surface level of the second recess R2 may be lower than a lowermost surface level of the second nano-sheet stack NS2 including the plurality of second nano-sheets N2.

A plurality of gate lines GL may be on the fin-type active region FA. The plurality of gate lines GL may extend a given length in a second horizontal direction (a Y direction) intersecting with the first horizontal direction (the X direction).

The first nano-sheet stack NS1 and the second nano-sheet stack NS2 may be disposed in regions where the fin-type active region FA intersects with the plurality of gate lines GL. The first nano-sheet stack NS1 and the second nano-sheet stack NS2 may overlap in the vertical direction (the Z direction). The plurality of first nano-sheets N1 and the plurality of second nano-sheets N2 overlapping in the vertical direction (the Z direction) may be surrounded by one gate line GL. It will be understood that "an element A surrounds an element B" (or similar language) as used herein means that the element A is at least partially around the element B but does not necessarily mean that the element A completely encloses the element B.

The first transistor TR1 and the second transistor TR2 overlapping in the vertical direction (the Z direction) may share one gate line GL, or may be coupled to a common gate line GL. That is, in one embodiment, a gate line GL configuring one selected first transistor TR1 and a gate line GL configuring a second transistor TR2 overlapping the one selected first transistor TR1 in the vertical direction (the Z direction) may have a structure where the gate lines GL are connected as one body.

In FIGS. 2A and 2B, an example has been described where the first nano-sheet stack NS1 includes two first nano-sheets N1 and the second nano-sheet stack NS2 includes two second nano-sheets N2, but the present disclosure is not limited to the illustrations of FIGS. 2A and 2B. For example, the first nano-sheet stack NS1 may include one or more first nano-sheets N1, and the second nano-sheet stack NS2 may include one or more second nano-sheets N2. The number of first nano-sheets N1 included in the first nano-sheet stack NS1 may be the same as or different from the number of second nano-sheets N2 included in the second nano-sheet stack NS2.

In FIG. 1, an example is illustrated where a planar shape of each of the first nano-sheet stack NS1 and the second nano-sheets N2 is approximately tetragonal, but the present disclosure is not limited thereto. Each of the first nano-sheet stack NS1 and the second nano-sheet stack NS2 may have various planar shapes on the basis of a planar shape of each of the fin-type active region FA and the gate line GL. In some embodiments, as illustrated in FIG. 1, a maximum width NW1 of the first nano-sheet stack NS1 may be greater than a maximum width NW2 of the second nano-sheet stack NS2 in the first horizontal direction (the X direction).

Each of the plurality of first nano-sheets N1 and the plurality of second nano-sheets N2 may have a channel region. For example, each of the plurality of first nano-sheets N1 and the plurality of second nano-sheets N2 may have a thickness selected from a range of about four nanometers (4 nm) to about six (6) nm, but the present disclosure is not limited thereto. Here, a thickness of each of the plurality of first nano-sheets N1 and the plurality of second nano-sheets N2 may denote a size in the vertical direction (the Z direction). In some embodiments, the plurality of first nano-sheets N1 and the plurality of second nano-sheets N2 may have substantially the same thickness in the vertical direction (the Z direction). In other embodiments, at least some nano-sheets among the plurality of first nano-sheets N1 and the plurality of second nano-sheets N2 may have different thicknesses in the vertical direction (the Z direction).

In some embodiments, a plurality of first nano-sheets N1 included in one first nano-sheet stack NS1 may have the same size in the first horizontal direction (the X direction). In other embodiments, a plurality of first nano-sheets N1 included in one first nano-sheet stack NS1 may have different sizes in the first horizontal direction (the X direction).

In some embodiments, a plurality of second nano-sheets N2 included in one second nano-sheet stack NS2 may have the same size in the first horizontal direction (the X direction). In other embodiments, a plurality of second nano-sheets N2 included in one second nano-sheet stack NS2 may have different sizes in the first horizontal direction (the X direction).

Each of the plurality of gate lines GL may include a main gate portion 160M and a plurality of sub gate portions 160S1, 160S2, and 160S3, which are connected as one body (unitary body). The main gate portion 160M may cover a top surface of the second nano-sheet stack NS2 and may extend a given length in the second horizontal direction (the Y direction).

The plurality of sub gate portions 160S1, 160S2, and 160S3 may include at least one first sub gate portion 160S1, at least one second sub gate portion 160S2, and a third sub gate portion 160S3 between the first sub gate portion 160S1 and the second sub gate portion 160S2.

The at least one first sub gate portion 160S1 may be on, and at least partially cover, the first nano-sheet N1 and may face the first source/drain region SD1 in the first horizontal direction (the X direction), at a level which is higher than a vertical level of the fin top FT of the fin-type active region FA and is lower than a vertical level of the third sub gate portion 160S3. The at least one first sub gate portion 160S1 may include a surface facing the first nano-sheet N1 and a surface facing the first source/drain region SD1.

The at least one second sub gate portion 160S2 may be on, and at least partially cover, the second nano-sheet N2 and may face the second source/drain region SD2 in the first horizontal direction (the X direction), at a vertical level which is higher than a vertical level of the third sub gate portion 160S3. The at least one second sub gate portion 160S2 may include a surface facing the second nano-sheet N2 and a surface facing the second source/drain region SD2.

As illustrated in FIG. 2A, a maximum width of the second sub gate portion 160S2 in the first horizontal direction (the X direction) may be less than a maximum width of the first sub gate portion 160S1. As illustrated in FIGS. 2A and 2B, in the vertical direction (the Z direction), a thickness of each of the first and second sub gate portions 160S1 and 160S2 may be less than that of the main gate portion 160M. In the vertical direction (the Z direction), a thickness of the third sub gate portion 160S3 may be less than or equal to that of the main gate portion 160M. The third sub gate portion 160S3 may include a surface which is at the same vertical level as the insulation pattern 130 and faces the insulation pattern 130.

The gate line GL may include metal, metal nitride, metal carbide, or a combination thereof. The metal may be selected from among titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may be selected from among TiN and TaN. The metal carbide may be TiAlC. However, a material of the gate line GL is not limited to the above description.

A gate dielectric layer 152 may be between the gate line GL and each of the plurality of first nano-sheets N1 and the plurality of second nano-sheets N2. In some embodiments, the gate dielectric layer 152 may have a stack structure of an interface layer and a high-k dielectric layer. The interface layer may include a low-k dielectric material layer where a dielectric constant is about 9 or less, and for example, may include silicon oxide, silicon nitride, or a combination thereof. As used herein, the term "low-k dielectric material" may refer to silicon oxide or a material having a dielectric constant which is less than that of silicon oxide. In some embodiments, the interface layer may be omitted. The high-k dielectric layer may include a material having a dielectric constant which is greater than that of silicon oxide. For example, the high-k dielectric layer may have a dielectric constant of about 10 to about 25. The high-k dielectric layer may include hafnium oxide, but is not limited thereto.

In some embodiments, each of the plurality of first nano-sheets N1 and the plurality of second nano-sheets N2 may include a semiconductor layer including the same element. In one embodiment, each of the plurality of first nano-sheets N1 and the plurality of second nano-sheets N2 may include a Si layer. In some embodiments, each of the plurality of first nano-sheets N1 and the plurality of second nano-sheets N2 may include a Si layer which is not doped. In other embodiments, the plurality of first nano-sheets N1 may include a Si layer doped with a dopant having the same conductive type as a conductive type of the first source/drain region SD1, and the plurality of second nano-sheets N2 may include a Si layer doped with a dopant having the same conductive type as a conductive type of the second source/drain region SD2. In other embodiments, the plurality of first nano-sheets N1 may include a Si layer doped with a dopant having a conductive type which is opposite to a conductive type of the first source/drain region SD1, and the plurality of second nano-sheets N2 may include a Si layer doped with a dopant having a conductive type which is opposite to a conductive type of the second source/drain region SD2.

As illustrated in FIG. 2A, both sidewalls of the gate line GL may be at least partially covered by an insulation spacer 118 on the substrate 102 and the second nano-sheet stack NS2. The gate dielectric layer 152 may include a portion disposed between the gate line GL and the insulation spacer 118. The insulation spacer 118 may be apart from the gate line GL with the gate dielectric layer 152 therebetween. The insulation spacer 118 may include silicon nitride, SiCN, SiBN, SiON, SiOCN, SiBCN, SiOC, or a combination thereof. For example, the insulation spacer 118 may include a double layer which includes an inner silicon nitride layer contacting the gate dielectric layer 152 and a SiOCN layer disposed apart from the gate dielectric layer 152 with the inner silicon nitride layer therebetween, but the present disclosure is not limited thereto.

As illustrated in FIGS. 2A and 2B, a top surface of the gate line GL may be at least partially covered by a capping insulation pattern 164. The capping insulation pattern 164 may include a silicon nitride layer. The capping insulation pattern 164 may cover a top surface of each of the gate line GL, the gate dielectric layer 152, and the insulation spacer 118.

As illustrated in FIG. 2A, the insulation spacer 118 and the second source/drain region SD2 may be at least partially covered by an insulation liner 142. In other embodiments, the insulation liner 142 may be omitted. The insulation liner 142, if present, may include silicon nitride (SiN), silicon oxide (SiO), SiCN, SiBN, SiON, SiOCN, SiBCN, SiOC, or a combination thereof. In embodiments, the insulation liner 142 may be omitted. An inter-gate insulation layer 144 may be disposed on the insulation liner 142. The inter-gate insulation layer 144 may include silicon nitride, silicon oxide, SiON, SiOCN, or a combination thereof. When the insulation liner 142 is omitted, the inter-gate insulation layer 144 may contact one or more of the plurality of first source/drain regions SD1.

The integrated circuit device 100 illustrated in FIGS. 1, 2A, and 2B may include the first transistor TR1 and the second transistor TR2, which are disposed to overlap each other in the vertical direction (the Z direction) on the fin-type active region FA, and the first transistor TR1 and the second transistor TR2 may have channel types of opposite conductive types. When the integrated circuit device 100 includes a device region having a reduced area on the basis of down-scaling, the first transistor TR1 and the second transistor TR2 having channel types of opposite conductive types may be stacked in a direction vertical to the main surface 102M of the substrate 102, and thus, the number of transistors per unit area may further be increased, thereby increasing the degree of integration of the integrated circuit device 100.

Also, in the integrated circuit device 100, the first source/drain region SD1 included in the first transistor TR1 and the second source/drain region SD2 included in the second transistor TR2 may have different sizes in a plane and/or a cross-sectional surface. For example, when the first transistor TR1 is an NMOS field effect transistor and the second transistor TR2 is a PMOS field effect transistor, a size of the first source/drain region SD1 may be set to be less than that of the second source/drain region SD2, and thus, the electrical performance of each of the first transistor TR1 and the second transistor TR2 may be improved.

Figure 3:
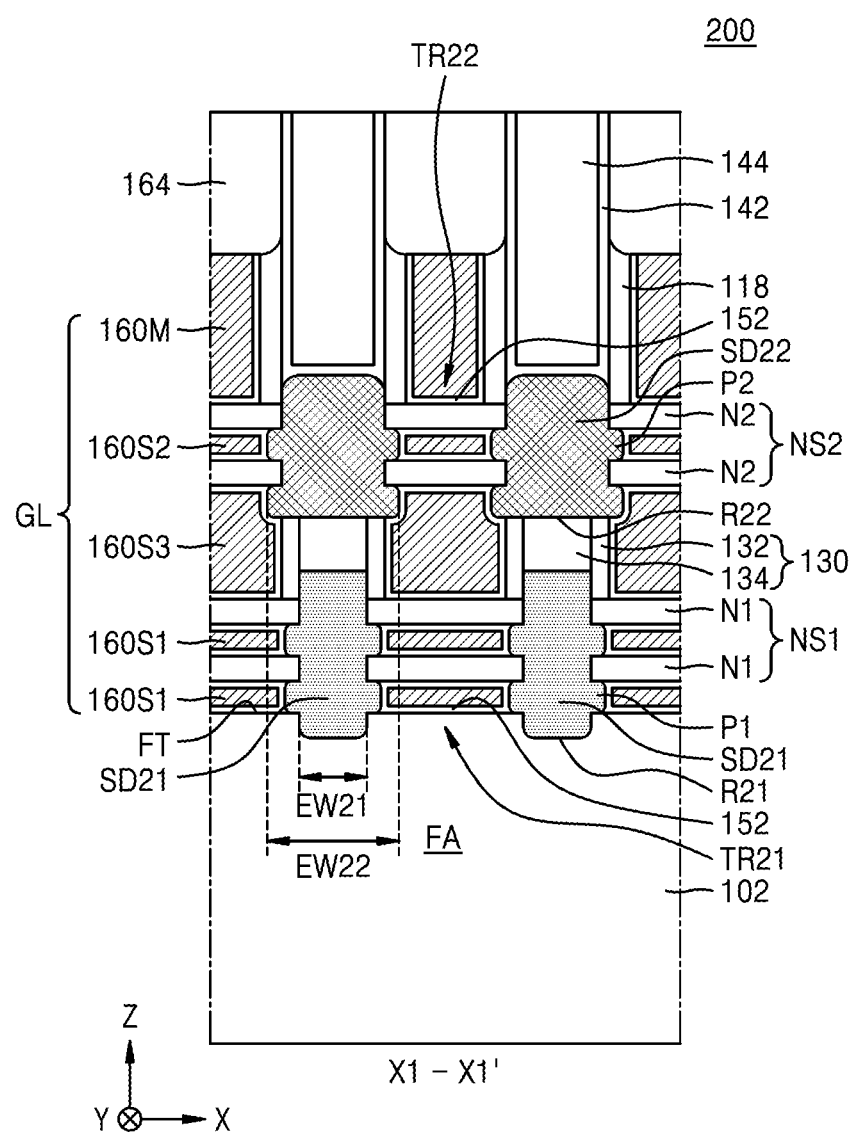
FIG. 3 is a cross-sectional view for describing an integrated circuit device according to other embodiments.

FIG. 3 is a cross-sectional view for describing an integrated circuit device 200 according to other embodiments. The integrated circuit device 200 may include a plane layout similar to the illustration of FIG. 1. In FIG. 3, a cross-sectional configuration corresponding to a cross-sectional surface taken along line X1-X1' of FIG. 1 is illustrated. In FIG. 3, the same reference numerals as FIGS. 1, 2A, and 2B refer to like elements, and thus, their detailed descriptions are omitted.

Referring to FIG. 3, the integrated circuit device 200 may have substantially the same configuration as that of the integrated circuit device 100 described above with reference to FIGS. 1, 2A, and 2B. However, the integrated circuit device 200 may include a first transistor TR21 and a second transistor TR22, which are disposed to overlap each other in a vertical direction (a Z direction) in a fin-type active region FA.

The first transistor TR21 and the second transistor TR22 may have substantially the same configuration as that of each of the first transistor TR1 and the second transistor TR2 described above with reference to FIGS. 1, 2A, and 2B. The first transistor TR21 may include a plurality of first source/drain regions SD21 respectively contacting a plurality of first nano-sheets N1, and the second transistor TR22 may include a plurality of second source/drain regions SD22 respectively contacting a plurality of second nano-sheets N2. In some embodiments, the plurality of first source/drain regions SD1 and the plurality of second source/drain regions SD2 may each constitute a pair, but the present disclosure is not limited to this number or arrangement.

In the integrated circuit device 200, each of the plurality of second source/drain regions SD22 may overlap the first source/drain region SD21 in the vertical direction (the Z direction). Each of the plurality of second source/drain regions SD22 may be apart from the fin-type active region FA in the vertical direction (the Z direction) with a respective one of the plurality of first source/drain regions SD21 therebetween. The first source/drain region SD21 and the second source/drain region SD22 may have different sizes. In some embodiments, in a plane (an X-Y plane) parallel to a substrate 102, a plane size of the second source/drain region SD22 may be greater than that of the first source/drain region SD21. In a first horizontal direction (an X direction), a maximum width EW22 of the second source/drain region SD22 may be greater than a maximum width EW21 of the first source/drain region SD21. Each of the plurality of first source/drain regions SD21 of the first transistor TR21 may partially or completely fill a first recess R21 formed in the fin-type active region FA. A lowermost surface level of the first recess R21 may be lower than the fin top FT of the fin-type active region FA. Each of the plurality of second source/drain regions SD22 of the second transistor TR22 may partially or completely fill a second recess R22 formed in the insulation pattern 130. A lowermost surface level of the second recess R22 may be lower than a lowermost surface level of the second nano-sheet stack NS2 including the plurality of second nano-sheets N2.

More detailed configurations of the first source/drain region SD21 and the second source/drain region SD22 may be substantially the same as those of the first source/drain region SD1 and the second source/drain region SD2 described above with reference to FIGS. 1, 2A, and 2B. The first source/drain region SD21 may include a plurality of first protrusion portions P1 which protrude toward a first sub gate portion 160S1 to overlap a portion of a first nano-sheet N1 in the vertical direction (the Z direction), and the second source/drain region SD22 may include a plurality of second protrusion portions P2 which protrude toward a second sub gate portion 160S2 to overlap a portion of a second nano-sheet N2 in the vertical direction (the Z direction). The first protrusion portion P1 may face a sidewall of the first sub gate portion 160S1 and may be apart from the first sub gate portion 160S1 with a gate dielectric layer 152 therebetween. The second protrusion portion P2 may face a sidewall of the second sub gate portion 160S2 and may be apart from the second sub gate portion 160S2 with the gate dielectric layer 152 therebetween.

In FIG. 3, an example is illustrated where the first protrusion portion P1 is included in the first source/drain region SD21 and the second protrusion portion P2 is included in the second source/drain region SD22, but one of the first source/drain region SD21 and the second source/drain region SD22 may not include the first protrusion portion P1 or the second protrusion portion P2. In some embodiments, in the integrated circuit device 200, the first source/drain region SD1 described above with reference to FIGS. 1, 2A, and 2B may be provided instead of the first source/drain region SD21. In other embodiments, in the integrated circuit device 200, the first source/drain region SD2 described above with reference to FIGS. 1, 2A, and 2B may be provided instead of the second source/drain region SD22. However, the present disclosure is not limited to the elements described above and may be variously modified and changed within the technical spirit.

FIGS. 4A to 16B are cross-sectional views illustrating a process sequence of an example method of manufacturing an integrated circuit device, according to some embodiments. FIGS. 4A, 5A, 6 to 12, 13A, 14A, 15A, and 16A are cross-sectional views based on an example process sequence in a cross-sectional surface taken along line X1-X1' of FIG. 1, and FIGS. 4B, 5B, 13B, 14B, 15B, and 16B are cross-sectional views based on an example process sequence in a cross-sectional surface taken along line Y1-Y1' of FIG. 1. A method of manufacturing the integrated circuit device 100 illustrated in FIGS. 1, 2A, and 2B will be described below with reference to FIGS. 4A to 16B. In FIGS. 4A to 16B, the same reference numerals as FIGS. 1, 2A, and 2B refer to like elements, and thus, their detailed descriptions are omitted.

Figure 4A:
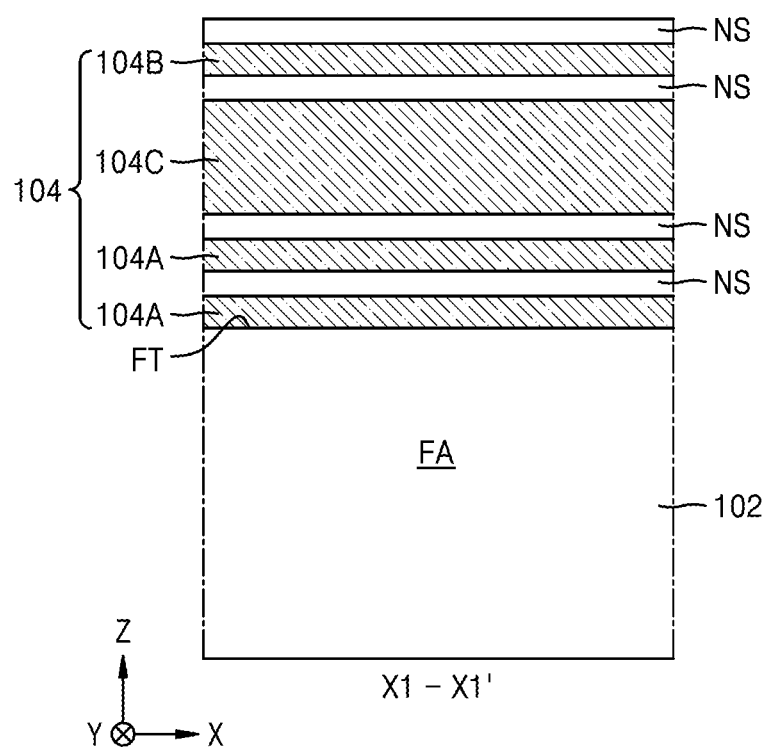
Figure 4B:
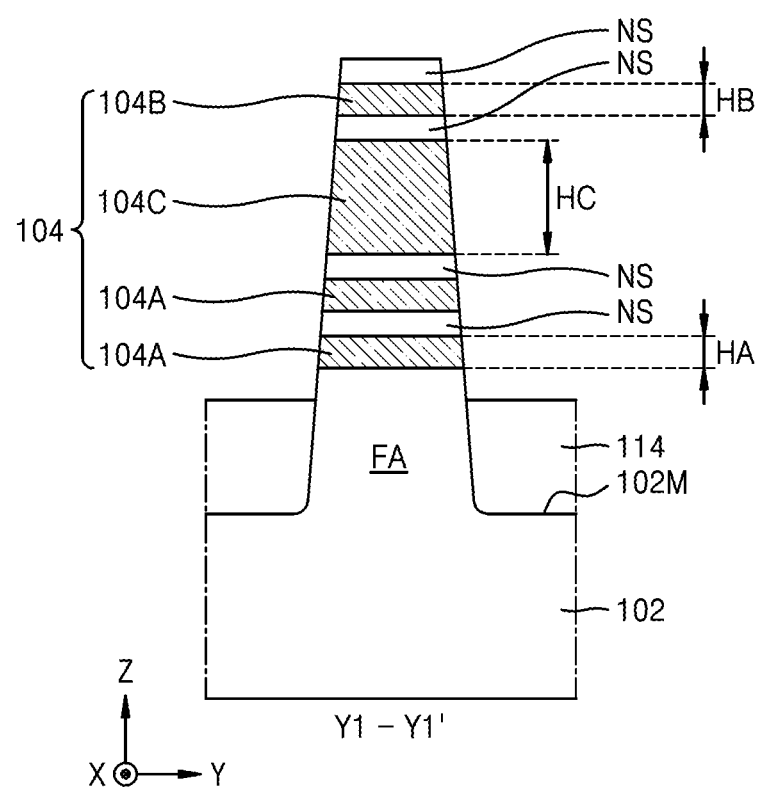

Referring to FIGS. 4A and 4B, a plurality of sacrificial semiconductor layers 104 and a plurality of nano-sheet semiconductor layers NS may be alternately stacked on a substrate 102, and a fin-type active region FA may be formed on the substrate 102 by etching the plurality of sacrificial semiconductor layers 104, the plurality of nano-sheet semiconductor layers NS, and a portion of the substrate 102. After the fin-type active region FA is formed, a stack structure of the plurality of sacrificial semiconductor layers 104 and the plurality of nano-sheet semiconductor layers NS may remain on the fin-type active region FA. Subsequently, an isolation layer 114 at least partially covering a lower sidewall of the fin-type active region FA may be formed on the substrate 102.

The plurality of sacrificial semiconductor layers 104 may include at least one first sacrificial semiconductor layer 104A, at least one second sacrificial semiconductor layer 104B, and a third sacrificial semiconductor layer 104C between the first sacrificial semiconductor layer 104A and the second sacrificial semiconductor layer 104B, which are stacked on the fin-type active region FA. In FIGS. 4A and 4B, an example is illustrated where two first sacrificial semiconductor layers 104A are stacked in the vertical direction (the Z direction) on the fin-type active region FA and one second sacrificial semiconductor layer 104B is stacked on the third sacrificial semiconductor layer 104C. In the vertical direction (the Z direction), a thickness HC of the third sacrificial semiconductor layer 104C may be greater than a thickness HA of the first sacrificial semiconductor layer 104A and may be greater than a thickness HB of the second sacrificial semiconductor layer 104B.

The plurality of sacrificial semiconductor layers 104 and the plurality of nano-sheet semiconductor layers NS may include different semiconductor materials having different etch selectivity. In some embodiments, the plurality of nano-sheet semiconductor layers NS may include a Si layer, and the plurality of sacrificial semiconductor layers 104 may include a SiGe layer. In some embodiments, a Ge concentration in the plurality of sacrificial semiconductor layers 104 may be constant. The SiGe layer configuring the plurality of sacrificial semiconductor layers 104 may have a Ge concentration selected within a range about 5 at % to about 60 at % (for example, about 10 at % to about 40 at % in some embodiments). A Ge concentration in the SiGe layer configuring the plurality of sacrificial semiconductor layers 104 may be variously selected depending on the case.

Figure 5A:
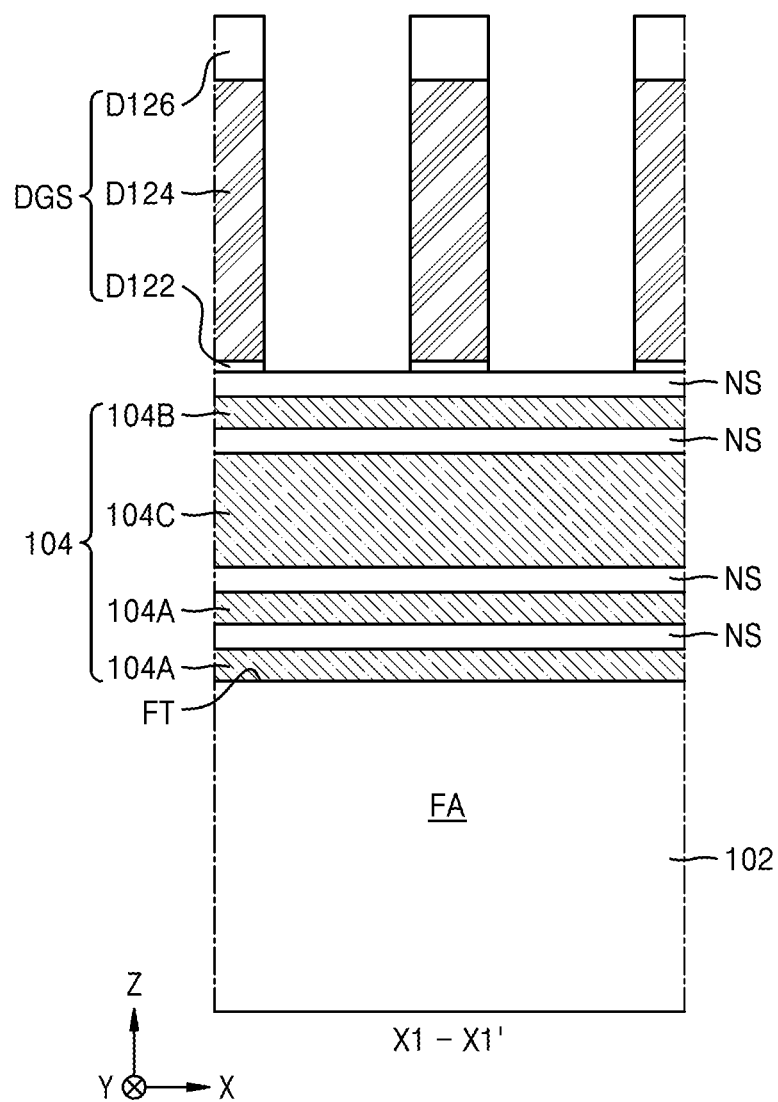
Figure 5B:
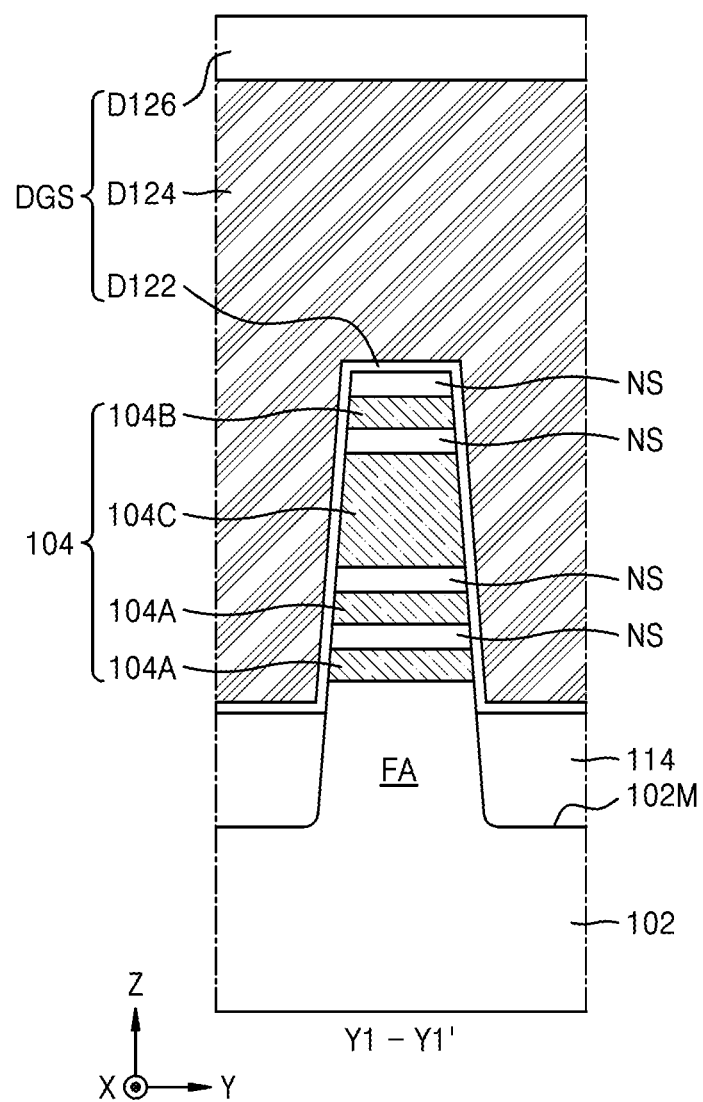

Referring to FIGS. 5A and 5B, a plurality of dummy gate structures DGS may be formed on the isolation layer 114 and a stack structure of the plurality of sacrificial semiconductor layers 104 and the plurality of nano-sheet semiconductor layers NS.

Each of the plurality of dummy gate structures DGS may be formed to extend a certain length in a second horizontal direction (a Y direction). Each of the plurality of dummy gate structures DGS may have a structure where an oxide layer D122, a dummy gate layer D124, and a capping layer D126 are stacked. In some embodiments, the oxide layer D122, the dummy gate layer D124, and the capping layer D126 may be stacked sequentially in that order. In some embodiments, the dummy gate layer D124 may include polysilicon, and the capping layer D126 may include silicon nitride.

Figure 6:
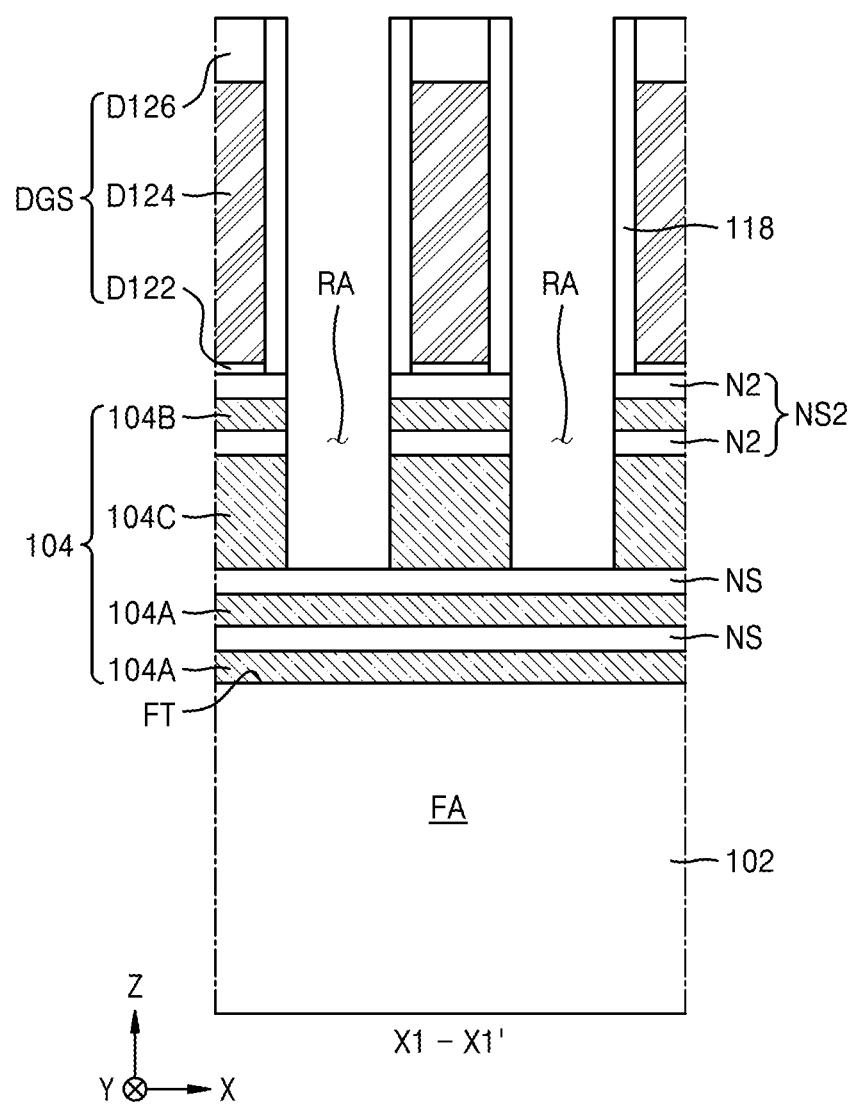

Referring to FIG. 6, a plurality of insulation spacers 118 covering at least a portion of both sidewalls of each of the plurality of dummy gate structures DGS may be formed. Then, a plurality of middle recesses RA may be formed by removing a portion of each of the plurality of sacrificial semiconductor layers 104 and a portion of each of the plurality of nano-sheet semiconductor layers NS by using the plurality of dummy gate structures DGS and the plurality of insulation spacers 118 as an etch mask and the plurality of nano-sheet semiconductor layers NS on the third sacrificial semiconductor layer 104C may be divided into a plurality of second nano-sheet stacks NS2. Each of the plurality of second nano-sheet stacks NS2 may include a plurality of second nano-sheets N2 which are stacked in the vertical direction (the Z direction).

In a resultant material where the plurality of second nano-sheet stacks NS2 are formed, the plurality of second nano-sheets N2, the second sacrificial semiconductor layer 104B, and the third sacrificial semiconductor layer 104C may be exposed through the plurality of middle recesses RA. In FIG. 6, an example is illustrated where the nano-sheet semiconductor layer NS is exposed at a bottom surface of each of the plurality of middle recesses RA, but the present disclosure is not limited thereto. For example, after the plurality of middle recesses RA are formed, the third sacrificial semiconductor layer 104C may be exposed at the bottom surface of each of the plurality of middle recesses RA, and an uppermost nano-sheet semiconductor layer NS of the plurality of nano-sheet semiconductor layers NS remaining on the substrate 102 may be at least partially covered by the third sacrificial semiconductor layer 104C so as not to be exposed through the plurality of middle recesses RA.

In order to form the plurality of middle recesses RA, etching may be performed by using dry etching, wet etching, or a combination thereof. In some embodiments, an HCl (Hydrochloric) gas, a $Cl_2$ (Chlorine) gas, and/or an $SF_3$ (Sulfur trichloride) gas, or other gases having an etching characteristic similar thereto may be used for forming the plurality of middle recesses RA, but the present disclosure is not limited thereto.

Figure 7:
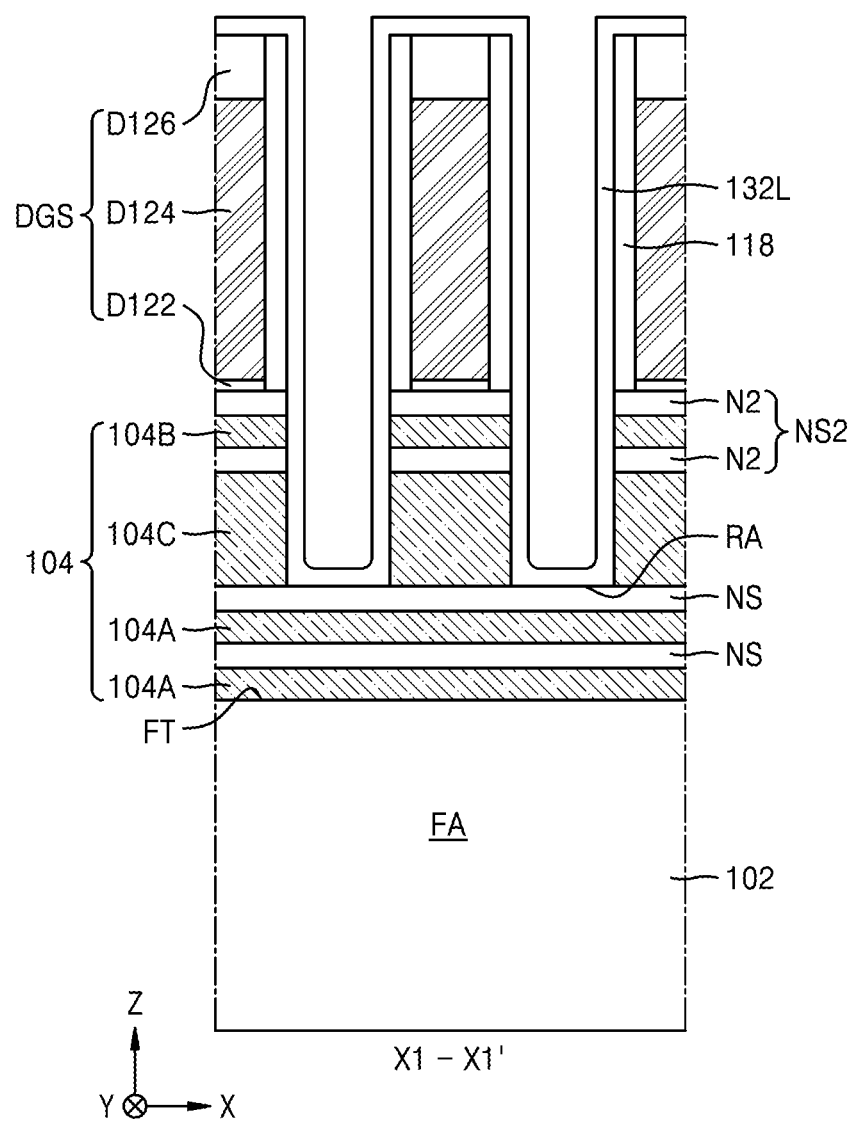

Referring to FIG. 7, an insulation liner 132L that conforms to, and at least partially covers, exposed surfaces of a resultant material of FIG. 6 may be formed. The insulation liner 132L may include SiN, SiO, SiCN, SiBN, SiON, SiOCN, SiBCN, SiOC, or a combination thereof. In some embodiments, the insulation liner 132L may include a material which differs from a material of the insulation spacer 118. In other embodiments, the insulation liner 132L may include the same material as that of the insulation spacer 118.

Figure 8:
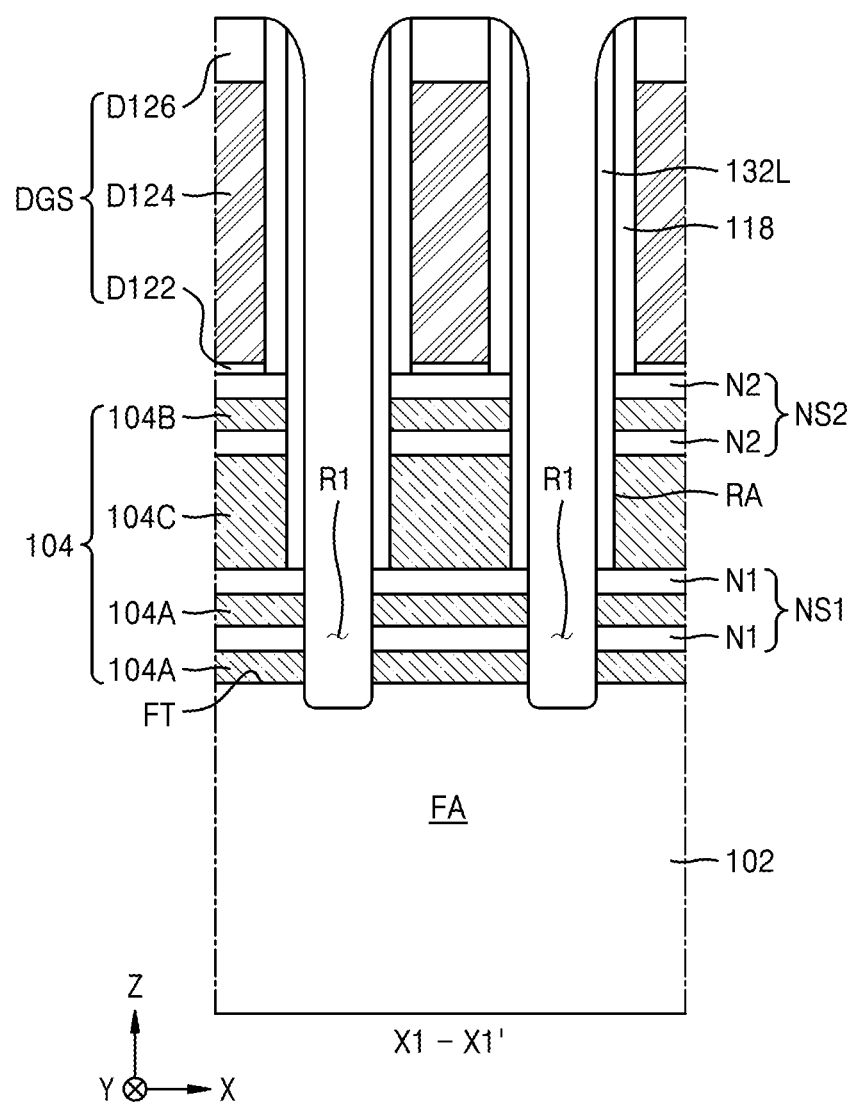

Referring to FIG. 8, a bottom surface of each of the plurality of middle recesses RA may be exposed by performing anisotropic etching on the insulation liner 132L in a resultant material of FIG. 7. Then, a plurality of first recesses R1 may be formed by removing a portion of each of the plurality of sacrificial semiconductor layers 104 and a portion of each of the plurality of nano-sheet semiconductor layers NS each remaining under the plurality of middle recesses RA by using the plurality of dummy gate structures DGS, the plurality of insulation spacers 118, and a remaining insulation liner 132L as an etch mask. The plurality of nano-sheet semiconductor layers NS under the middle recess RA may be divided into a plurality of first nano-sheet stacks NS1. Each of the plurality of first nano-sheet stacks NS1 may include a plurality of first nano-sheets N1 which are stacked in the vertical direction (the Z direction).

In a resultant material where the plurality of first nano-sheet stacks NS1 are formed, the plurality of first nano-sheets N1, the first sacrificial semiconductor layer 104A, and the fin-type active region FA may be exposed through the plurality of first recesses R1. Each of the plurality of first recesses R1 may be connected to a corresponding middle recess RA. A vertical level of a bottom surface of each of the plurality of first recesses R1 may be lower than a vertical level of a fin top FT of the fin-type active region FA, but the present disclosure is not limited thereto. For example, the vertical level of the bottom surface of each of the plurality of first recesses R1 may be substantially the same as the vertical level of the fin top FT of the fin-type active region FA. While an etching process for forming the plurality of first recesses R1 is being performed, a portion of the insulation spacer 118 may be removed.

Figure 9:
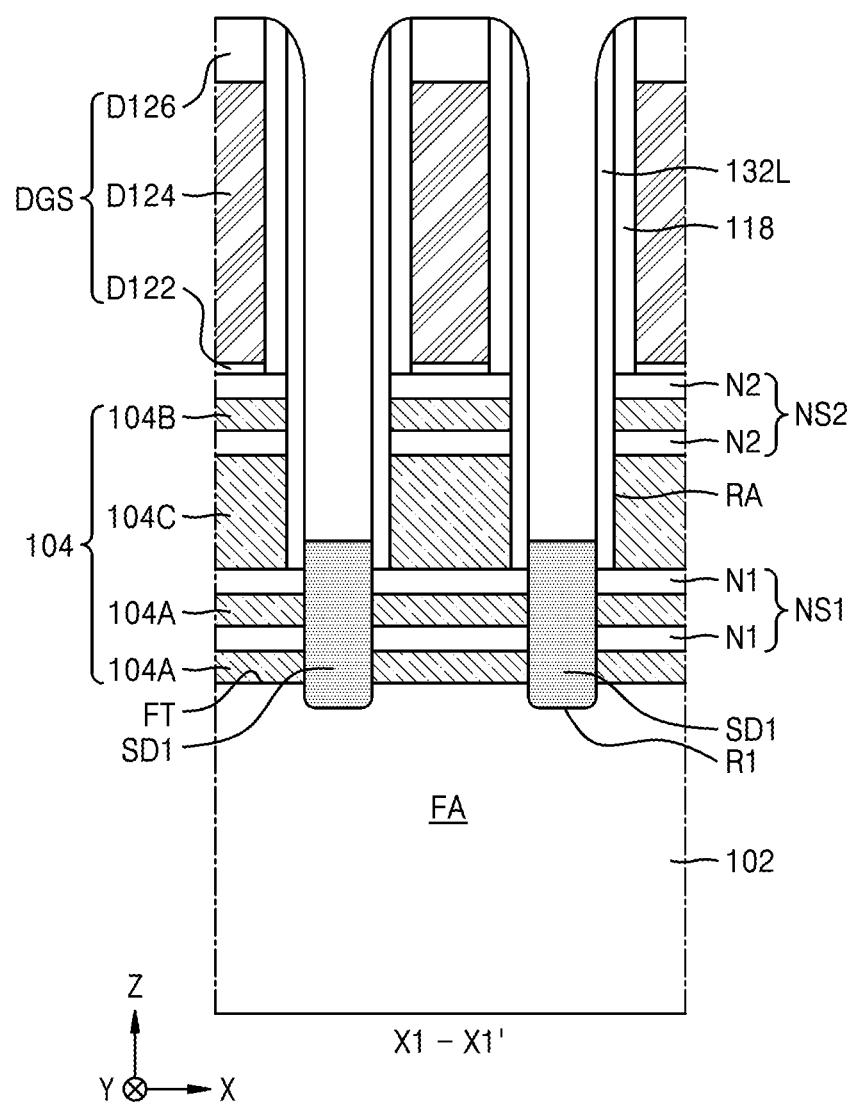

Referring to FIG. 9, a plurality of first source/drain regions SD1 that at least partially fills the plurality of first recesses R1 may be formed in a resultant material of FIG. 8.

A selective epitaxial growth process may be performed for forming the plurality of first source/drain regions SD1. At an initial step of the selective epitaxial growth process, a semiconductor layer may be locally and epitaxially grown from a surface of the fin-type active region FA and surfaces of the plurality of first nano-sheets N1 exposed in the plurality of first recesses R1. Subsequently, as the selective epitaxial growth process is performed, the semiconductor layer may be progressively grown, and thus, the plurality of first source/drain regions SD1 illustrated in FIG. 9 may be obtained.

In some embodiments, in a case where the plurality of first source/drain regions SD1 include a Si layer doped with an n-type dopant, a Si source may be used for forming the plurality of first source/drain regions SD1 through the selective epitaxial growth process. The Si source may use silane ($SiH_4$), disilane ($Si_2H_6$), trisilane ($Si_3H_8$), or dichlorosilane ($SiH_2Cl_2$), but is not limited thereto. The n-type dopant may be selected from among phosphorus (P), arsenic (As), and antimony (Sb).

Figure 10:
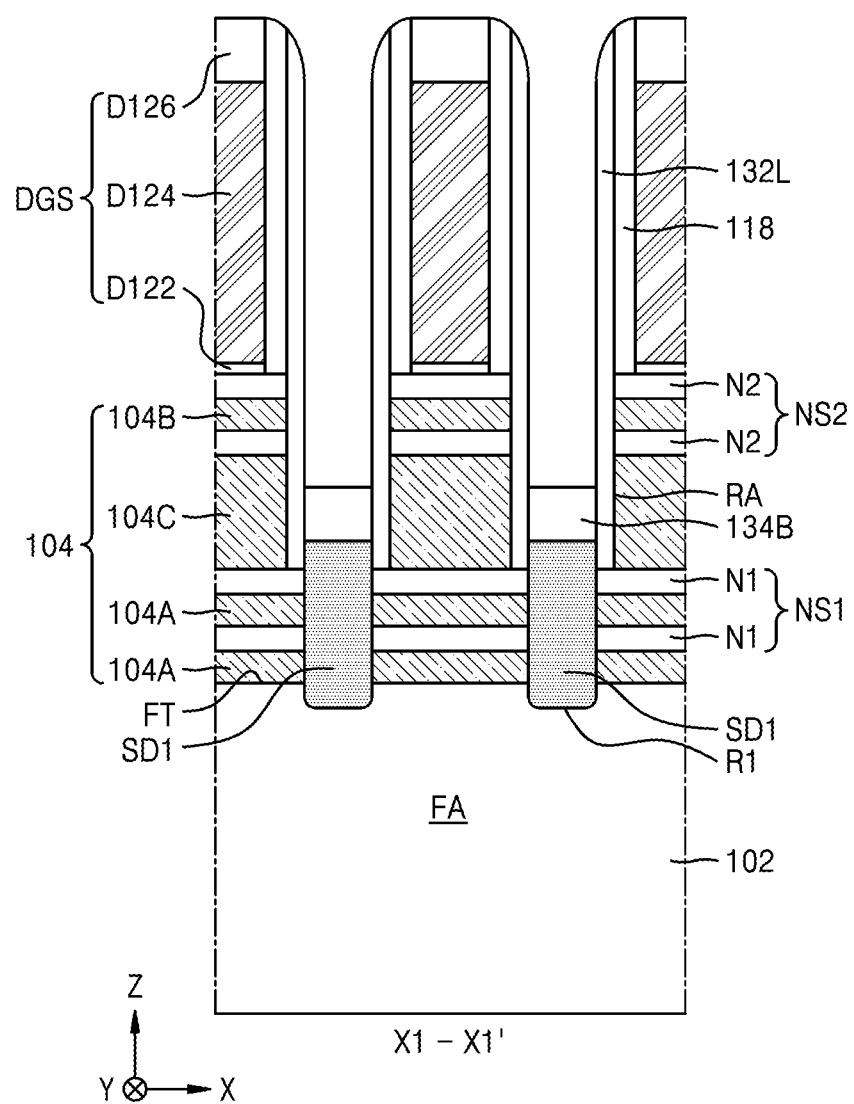

Referring to FIG. 10, a plurality of insulation blocks 134B that at least partially covers exposed surfaces of the plurality of first source/drain regions SD1 may be formed in a resultant material of FIG. 9. A vertical level of an uppermost surface of each of the plurality of insulation blocks 134B may be lower than a vertical level of an uppermost surface of the third sacrificial semiconductor layer 104C. In some embodiments, the plurality of insulation blocks 134B may include SiN, SiO, SiCN, SiBN, SiON, SiOCN, SiBCN, SiOC, or a combination thereof.

Figure 11:
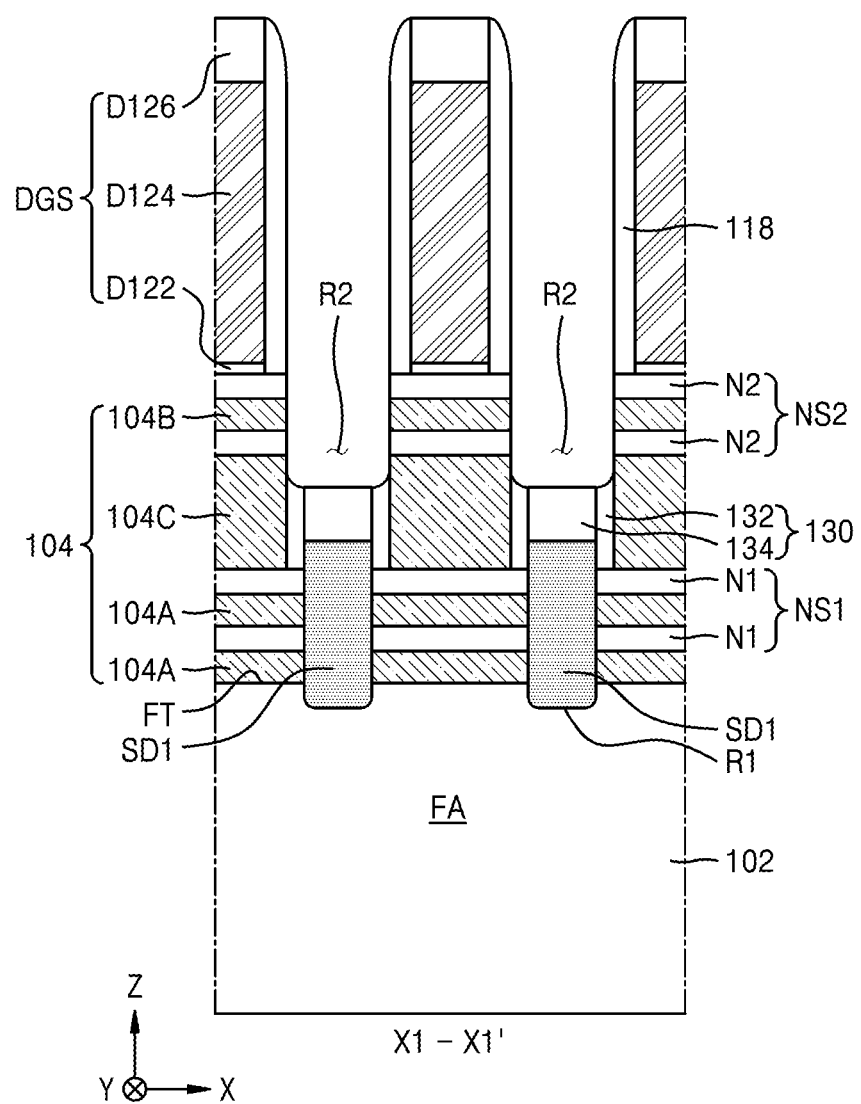

Referring to FIG. 11, a plurality of second recesses R2 may be formed by performing etchback on a portion of the insulation liner 132L in a resultant material of FIG. 10. The plurality of second recesses R2 at least partially expose sidewalls of the plurality of insulation spacers 118 and at least partially expose top surfaces of the plurality of insulation blocks 134B and a sidewall of each of the second sacrificial semiconductor layer 104B, the third sacrificial semiconductor layer 104C, and the plurality of second nano-sheets N2.

After the plurality of second recesses R2 are formed, a portion of the insulation liner 132L may remain as a plurality of first insulation patterns 132, and the plurality of insulation blocks 134B may remain as a plurality of second insulation patterns 134. The first insulation pattern 132 and the second insulation pattern 134 together form insulation pattern 130 and may limit a bottom surface of the second recess R2. A vertical level of a top surface of the second insulation pattern 134 limiting the bottom surface of the second recess R2 may be lower than a vertical level of an uppermost surface of the third sacrificial semiconductor layer 104C.

Figure 12:
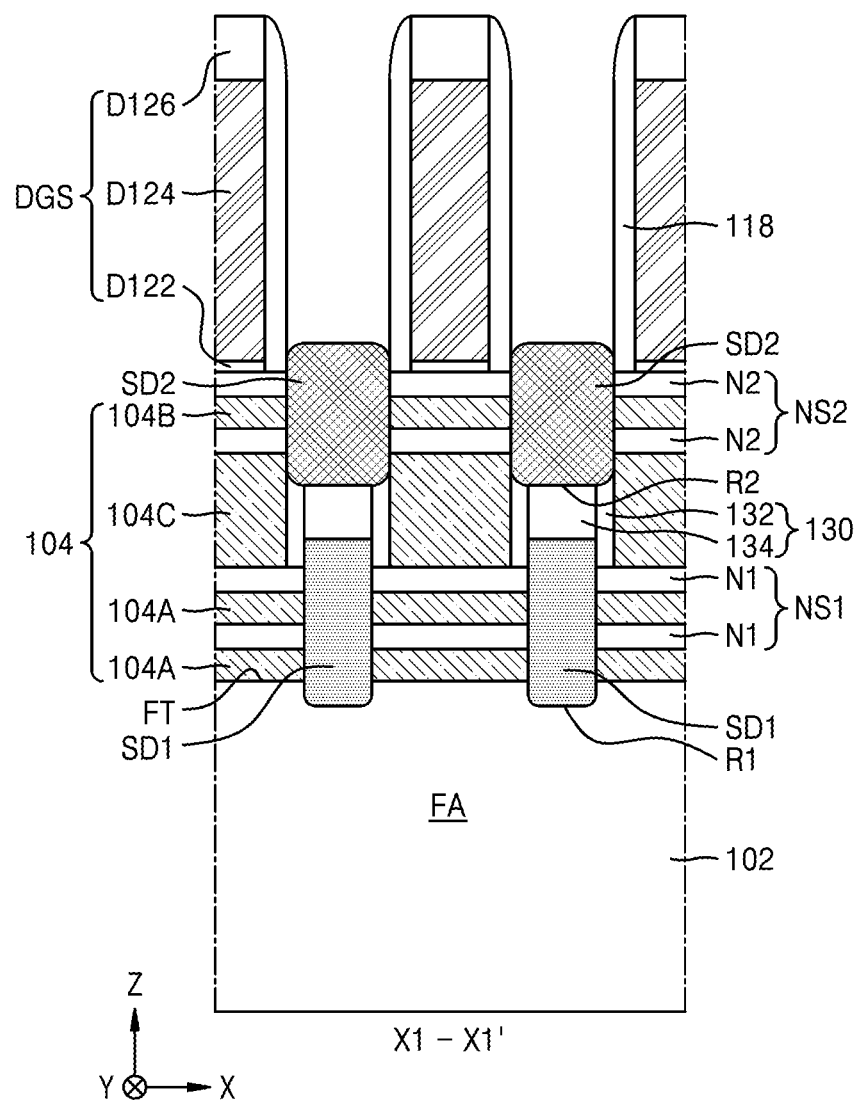

Referring to FIG. 12, a plurality of second source/drain regions SD2 at least partially filling the plurality of second recesses R2 may be formed in a resultant material of FIG. 11.

A selective epitaxial growth process may be performed for forming the plurality of second source/drain regions SD2 in some embodiments. At an initial step of the selective epitaxial growth process, a semiconductor layer may be locally and epitaxially grown from surfaces of the plurality of second nano-sheets N2 exposed in the plurality of second recesses R2. Subsequently, as the selective epitaxial growth process is performed, the semiconductor layer may be progressively grown, and thus, the plurality of second source/drain regions SD2 illustrated in FIG. 12 may be obtained.

In some embodiments, in a case where the plurality of second source/drain regions SD2 include a SiGe layer doped with a p-type dopant, a Si source and a Ge source may be formed for forming a SiGe layer doped with the p-type dopant. The Si source may use silane ($SiH_4$), disilane ($Si_2H_6$), trisilane ($Si_3H_8$), or dichlorosilane ($SiH_2Cl_2$). The Ge source may use germane ($GeH_4$), digermane ($Ge_2H_6$), trigermane ($Ge_3H_8$), tetragermane ($Ge_4H_{10}$), or dichlorogermane ($Ge_2H_2Cl_2$). The p-type dopant may be selected from among boron (B) and gallium (Ga).

Figure 13A:
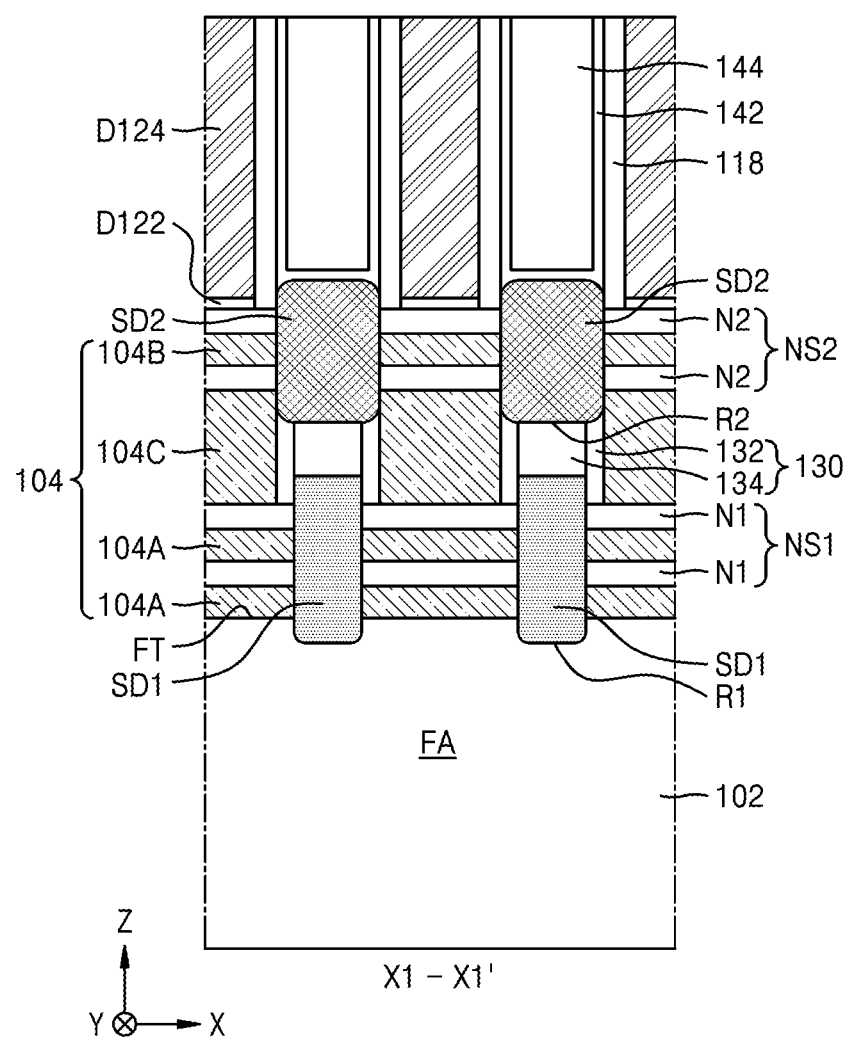
Figure 13B:
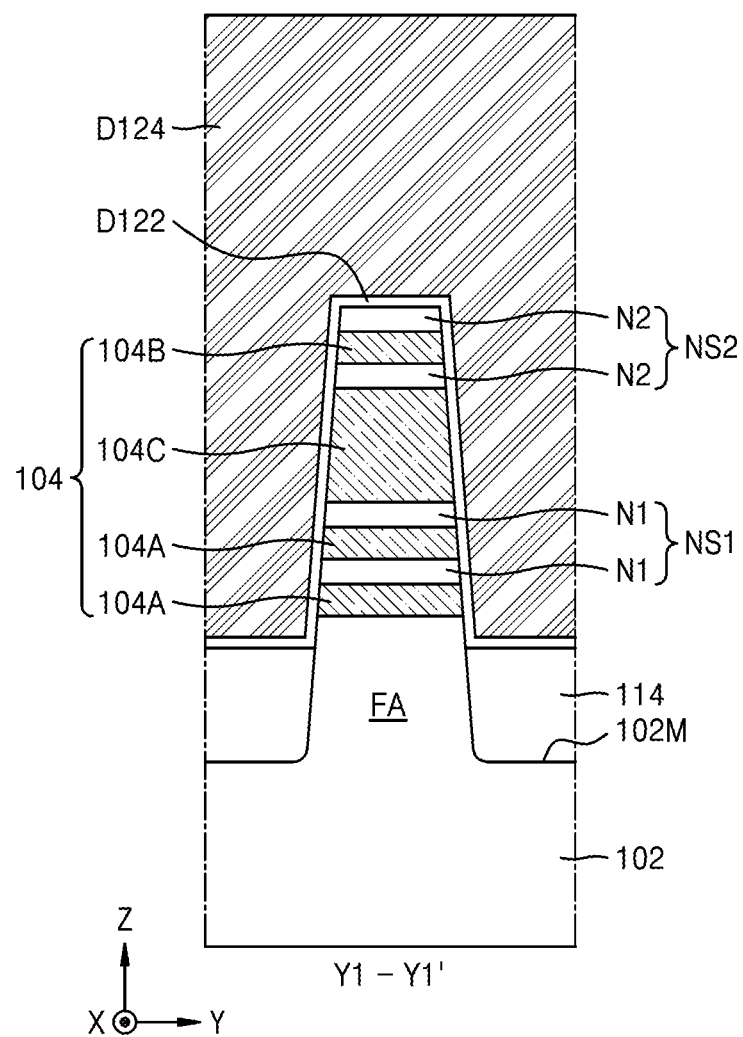

Referring to FIGS. 13A and 13B, an insulation liner 142 may be formed that at least partially covers a resultant material of FIG. 12, where a plurality of second source/drain regions SD2 are formed. An inter-gate insulation layer 144 may be formed on the insulation liner 142, and a top surface of a capping layer D126 may be exposed by planarizing the insulation liner 142 and the inter-gate insulation layer 144. Subsequently, a top surface of a dummy gate layer D124 may be exposed by removing the capping layer D126, and a portion of each of the insulation liner 142 and the inter-gate insulation layer 144 may be removed so that a top surface of the insulation liner 142 and a top surface of the inter-gate insulation layer 144 are disposed at substantially the same level.

Figure 14A:
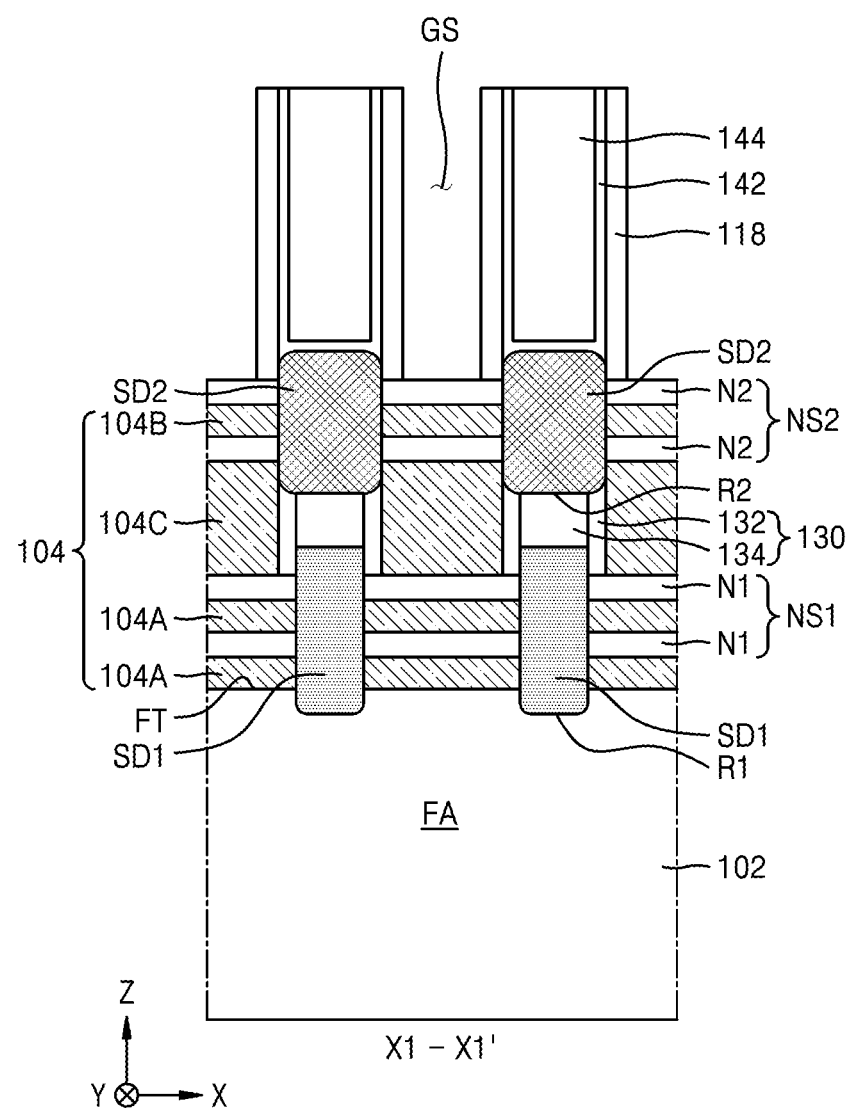
Figure 14B:
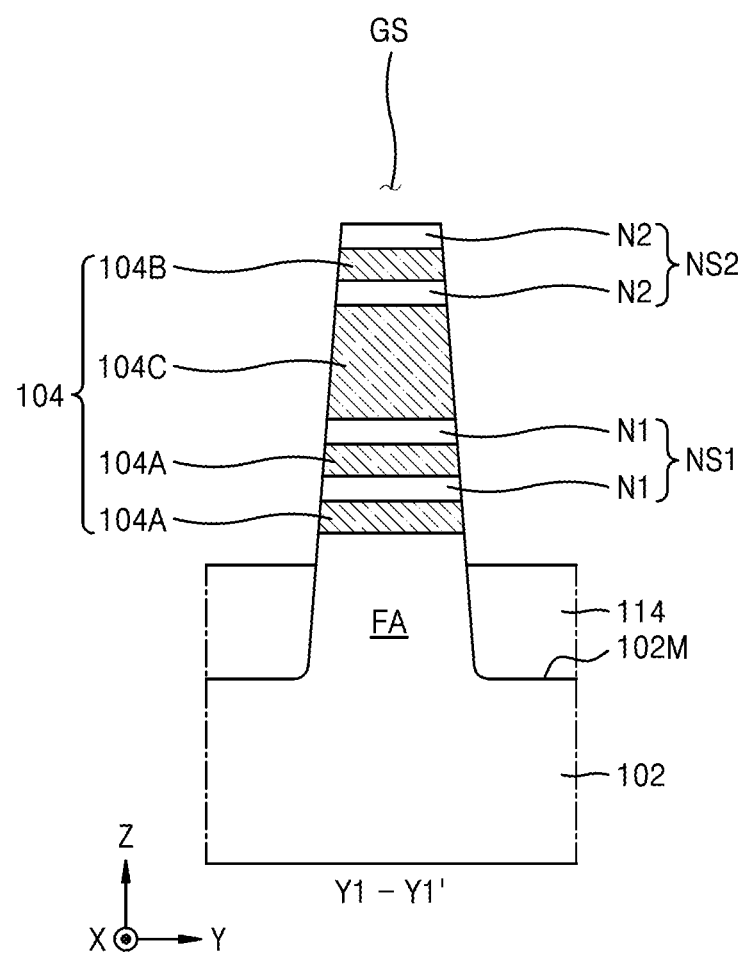

Referring to FIGS. 14A and 14B, a gate space GS may be provided by removing the dummy gate layer D124 and an oxide layer D122 thereunder from a resultant material of FIGS. 13A and 13B, and top surfaces of the plurality of second nano-sheets N2 may be exposed through the gate space GS.

Figure 15A:
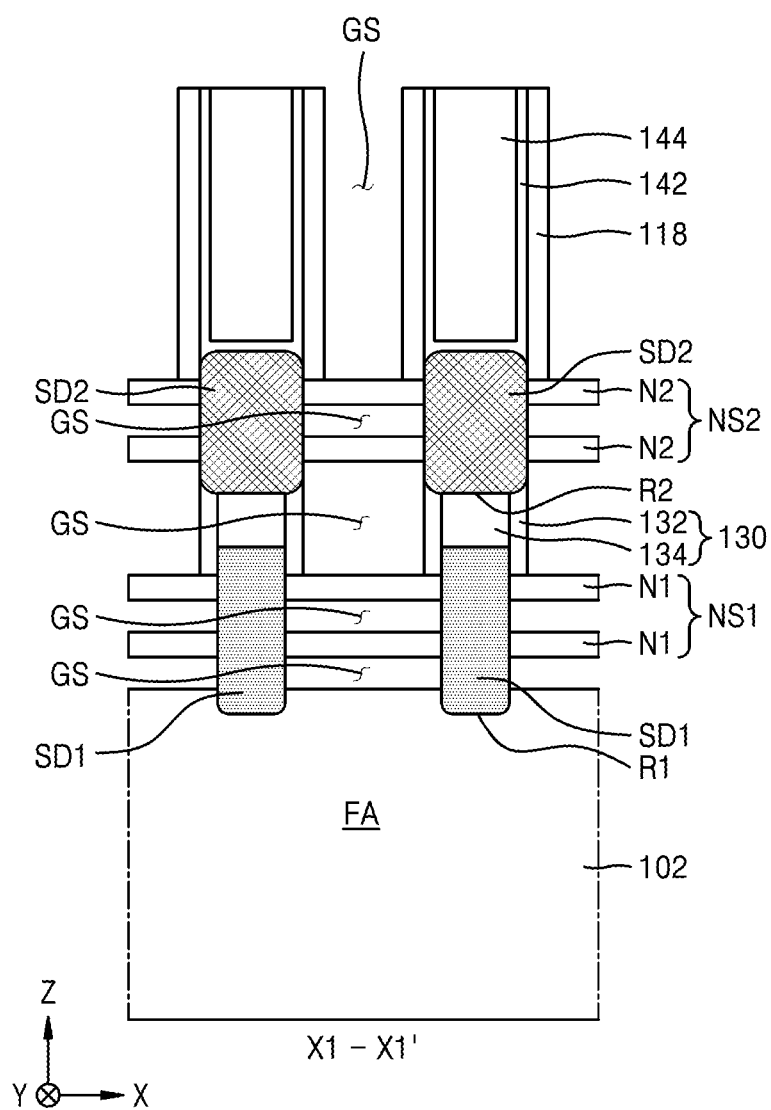
Figure 15B:
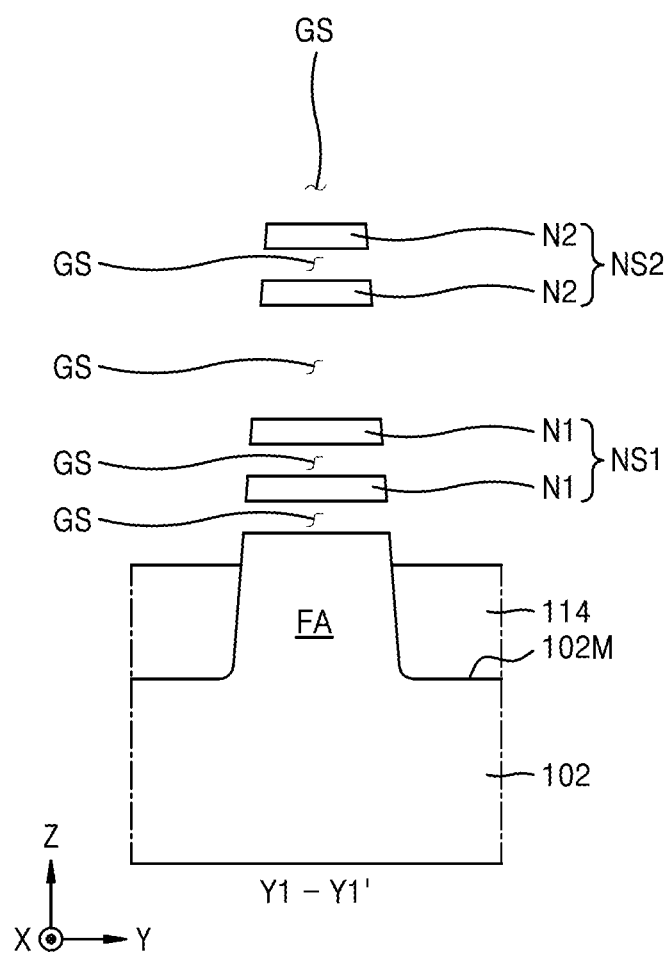

Referring to FIGS. 15A and 15B, by removing, through the gate space GS, the plurality of sacrificial semiconductor layers 104 remaining on the fin-type active region FA from a resultant material of FIGS. 14A and 14B, the gate space GS may extend up to the fin-type active region FA.

In some embodiments, an etch selectivity difference between the plurality of sacrificial semiconductor layers 104 and the plurality of first and second nano-sheets N1 and N2 may be used for selectively removing the plurality of sacrificial semiconductor layers 104. A liquid or gaseous etchant may be used for selectively removing the plurality of sacrificial semiconductor layers 104. In embodiments, a $CH_3COOH$-based etchant (for example, an etchant including a compound of $CH_3COOH$, $HNO_3$, and HF, or an etchant including a compound of $CH_3COOH$, $H_2O_2$, and HF) may be used for selectively removing the plurality of sacrificial semiconductor layers 104, but the present disclosure is not limited to the above description.

After the gate space GS extends up to the fin-type active region FA, the first source/drain region SD1 and the second source/drain region SD2 may be exposed through the gate space GS.

Figure 16A:
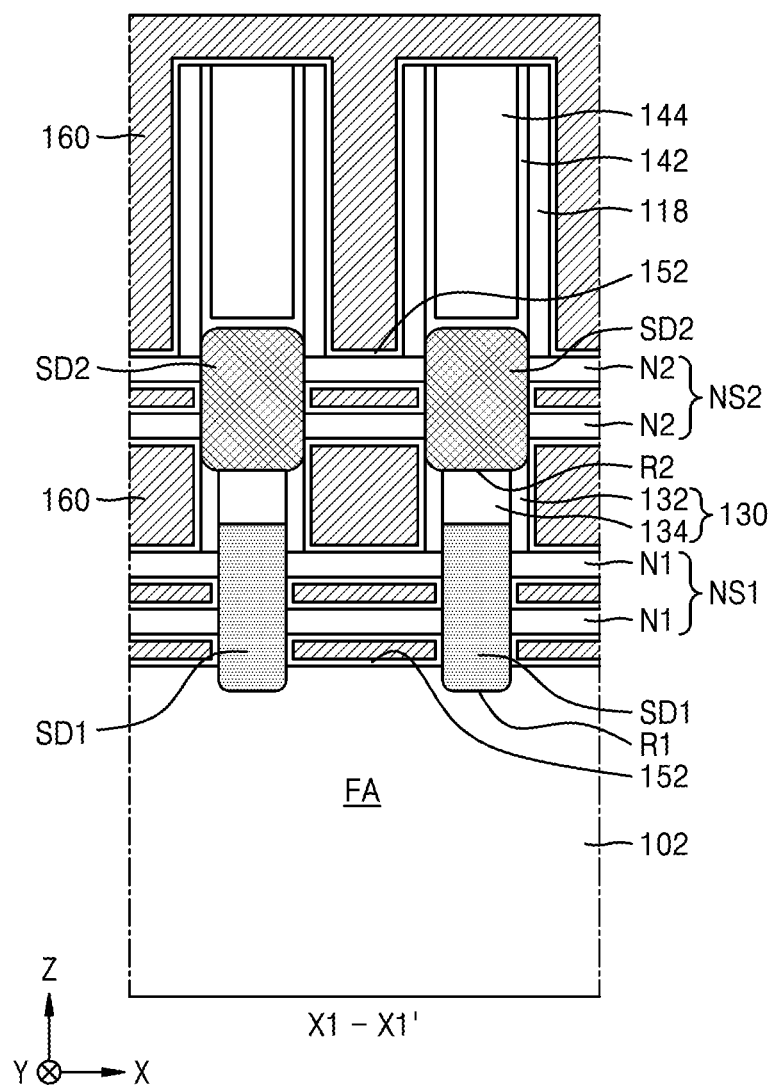
Figure 16B:
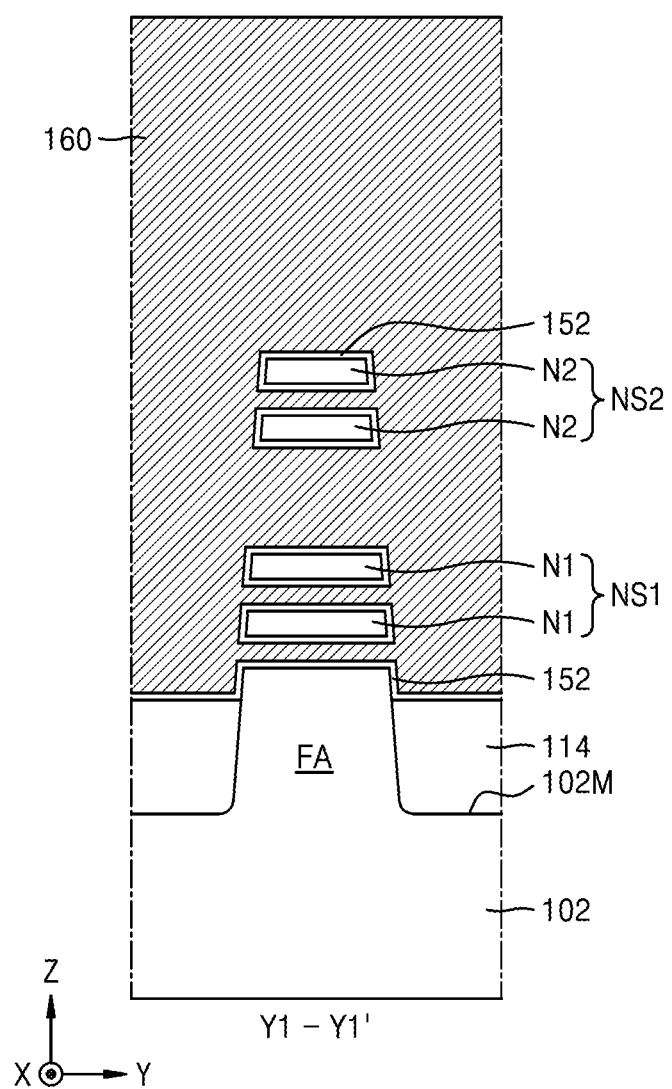

Referring to FIGS. 16A and 16B, a gate dielectric layer 152 that at least partially covers exposed surfaces of each of the fin-type active region FA, the plurality of first nano-sheets N1, the plurality of second nano-sheets N2, the first source/drain region SD1, and the second source/drain region SD2 exposed through the gate space GS, may be formed in a resultant material of FIGS. 15A and 15B. An atomic layer deposition (ALD) process may be used for forming the gate dielectric layer 152.

Subsequently, a gate formation conductive layer 160 at least partially filling the gate space GS (see FIGS. 15A and 15B) and at least partially covering a top surface of the inter-gate insulation layer 144 may be formed on the gate dielectric layer 152. The gate formation conductive layer 160 may include metal, metal nitride, metal carbide, or a combination thereof. An ALD process or a chemical vapor deposition (CVD) process may be used for forming the gate formation conductive layer 160.

Subsequently, the gate line GL illustrated in FIGS. 2A and 2B may be formed by removing a portion of the gate formation conductive layer 160 from a top surface of the inter-gate insulation layer 144 so that the top surface of the inter-gate insulation layer 144 is exposed and at least a portion of an upper portion of the gate space GS is unfilled again. At this time, as illustrated in FIGS. 2A and 2B, a portion of an upper portion of each of the gate dielectric layer 152 and the insulation spacer 118 may be removed. Subsequently, a capping insulation pattern 164 filling the gate space GS may be formed on the gate line GL.

FIGS. 17 to 20 are cross-sectional views illustrating a process sequence of an example method of manufacturing an integrated circuit device, according to other embodiments. In FIGS. 17 to 20, a cross-sectional configuration, based on an example process sequence, of a portion corresponding to a cross-sectional surface taken along line X1-X1' of FIG. 3 is illustrated. A method of manufacturing the integrated circuit device 200 illustrated in FIG. 3 will be described below with reference to FIGS. 17 to 20. In FIG. 3, the same reference numerals as FIGS. 1 to 3 refer to like elements, and thus, their detailed descriptions are omitted.

Figure 17:
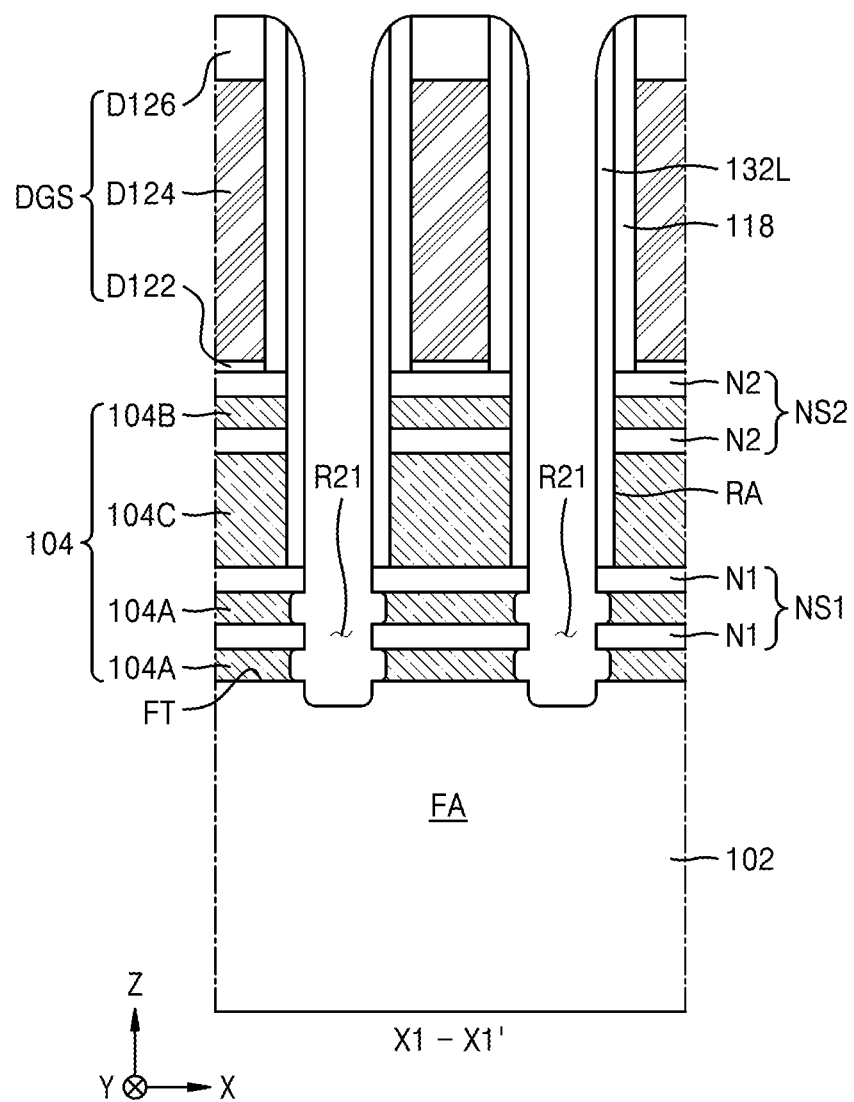
FIGS. 17 to 20 are cross-sectional views illustrating a process sequence of a method of manufacturing an integrated circuit device, such as the integrated circuit device of FIG. 3, according to other embodiments.

Referring to FIG. 17, processes described above with reference to FIGS. 4A to 8 may be performed. In a process described above with reference to FIG. 8, a plurality of first recesses R21 may be formed instead of forming a plurality of first recesses R1. To this end, by controlling an etch selectivity between the plurality of sacrificial semiconductor layers 104 and the plurality of nano-sheet semiconductor layers NS, a portion of each of the plurality of sacrificial semiconductor layers 104 and the plurality of nano-sheet semiconductor layers NS each remaining under each of the plurality of middle recesses RA may be etched in an etch atmosphere where an etch speed of the plurality of sacrificial semiconductor layers 104 is greater than a process of forming the first recess R1 illustrated in FIG. 8. As a result, the plurality of first recesses R21 may be formed to include indent spaces overlapping the first nano-sheet N1 in the vertical direction (the Z direction).

Figure 18:
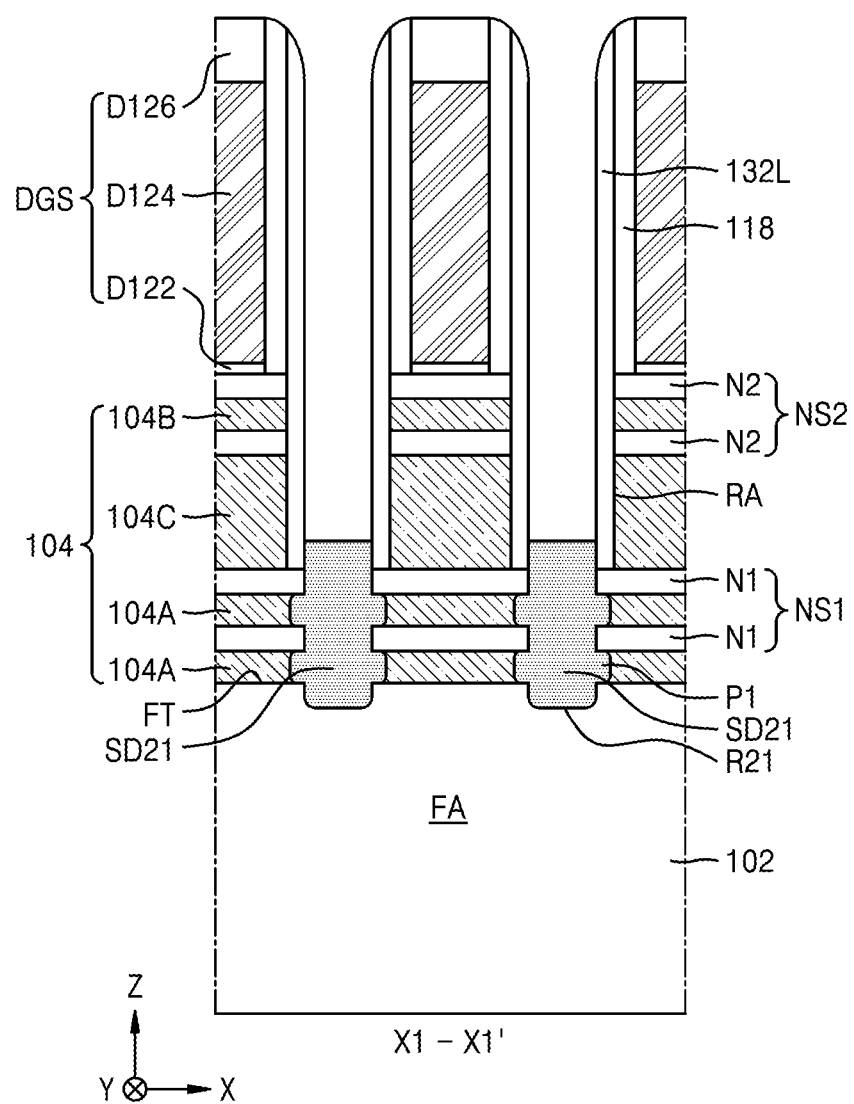

Referring to FIG. 18, a plurality of first source/drain regions SD21 at least partially filling the plurality of first recesses R21 in the resultant material of FIG. 17 may be formed by a method similar to the description of FIG. 9. The plurality of first source/drain regions SD21 may be formed to include a plurality of first protrusion portions P1 protruding toward the first sacrificial semiconductor layer 104A so as to overlap a portion of the first nano-sheet N1 in the vertical direction (the Z direction).

Figure 19:
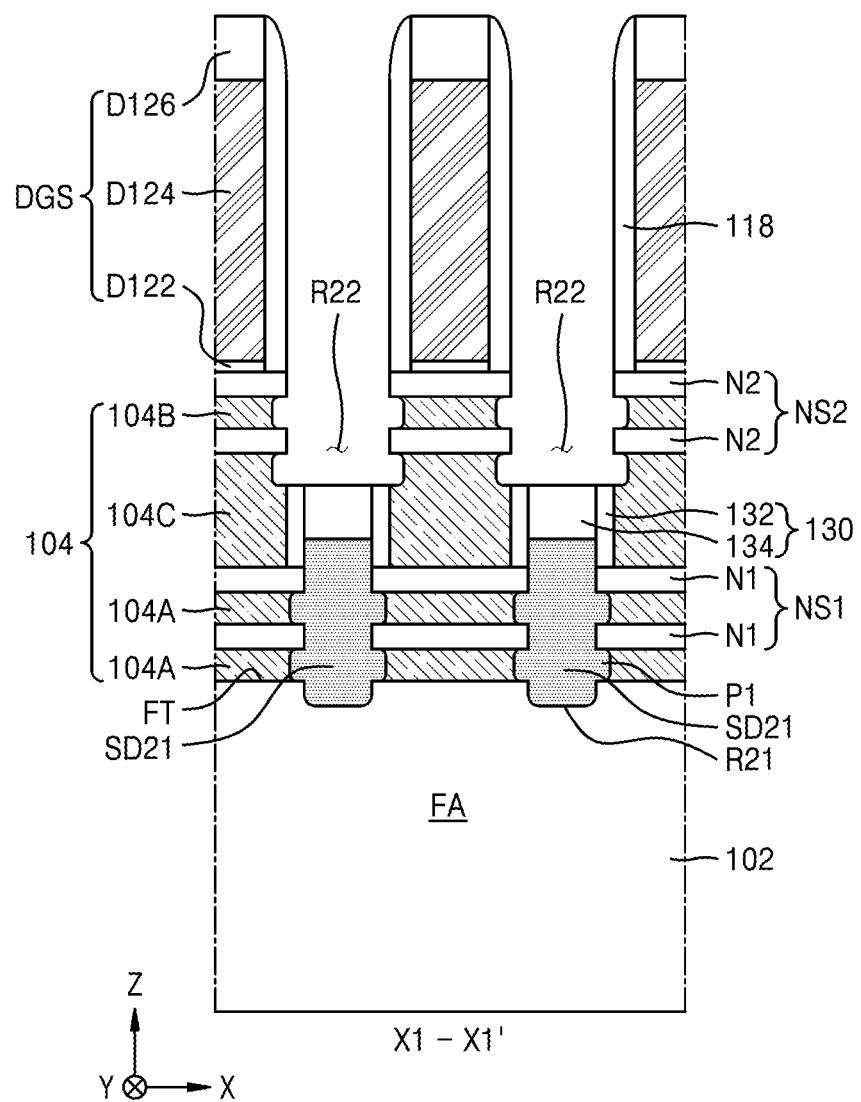

Referring to FIG. 19, processes similar to descriptions of FIGS. 10 and 11 may be performed in a resultant material of FIG. 18. In a process described above with reference to FIG. 11, a plurality of second recesses R22 may be formed instead of forming a plurality of second recesses R2. To this end, by controlling an etch selectivity between the second sacrificial semiconductor layer 104B and the second nano-sheet N2, a portion of the second sacrificial semiconductor layer 104B, a portion of the second sacrificial semiconductor layer 104B, and a portion of each of the plurality of second nano-sheets NS may be etched in an etch atmosphere where an etch speed of the second sacrificial semiconductor layer 104B is greater than a process of forming the second recess R2 illustrated in FIG. 11. As a result, the plurality of second recesses R22 may be formed to include indent spaces overlapping the second nano-sheet N2 in the vertical direction (the Z direction).

Figure 20:
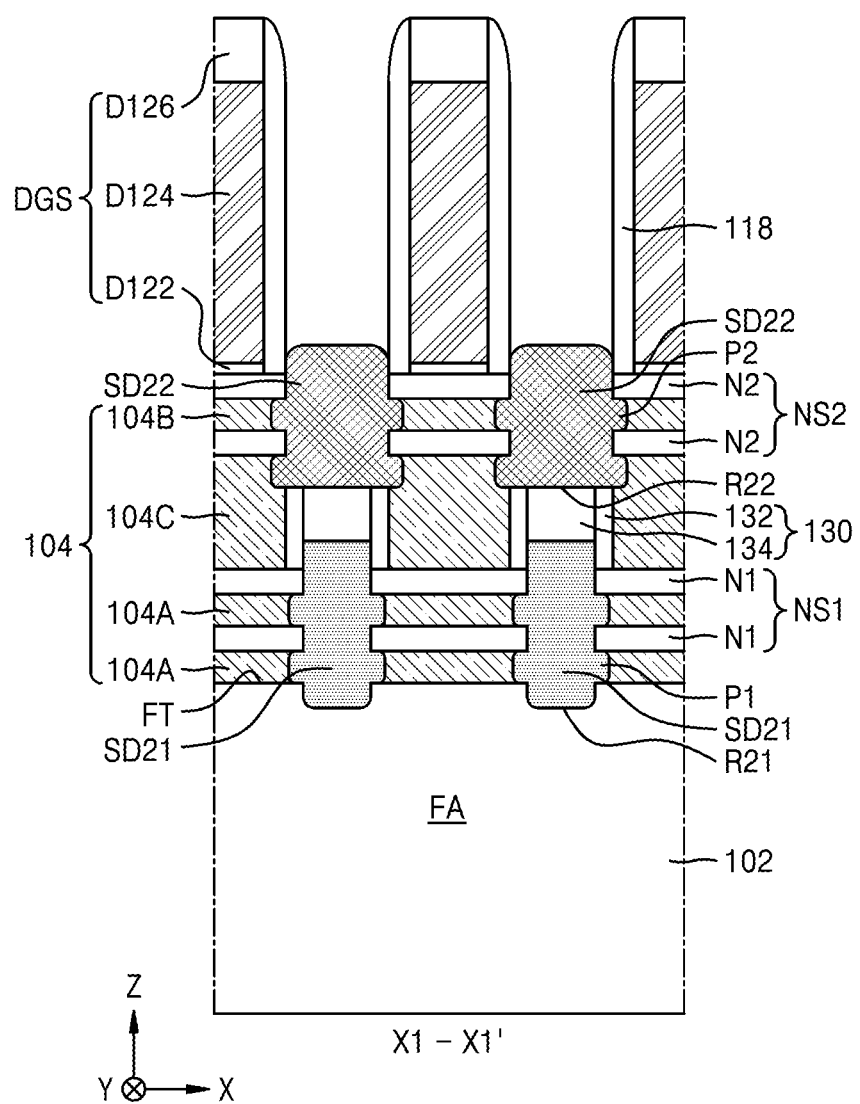

Referring to FIG. 20, a plurality of second source/drain regions SD22 at least partially filling the plurality of second recesses R22 in the resultant material of FIG. 19 may be formed by a method similar to the description of FIG. 12. The plurality of second source/drain regions SD22 may be formed to include a plurality of second protrusion portions P2 protruding toward the second sacrificial semiconductor layer 104B and the third sacrificial semiconductor layer 104C so as to overlap a portion of the second nano-sheet N2 in the vertical direction (the Z direction).

Subsequently, the integrated circuit device 200 illustrated in FIG. 3 may be manufactured by performing processes described above with reference to FIGS. 13A to 16B in a resultant material of FIG. 20.

Hereinabove, a method of manufacturing the integrated circuit devices 100 and 200 illustrated in FIGS. 1 to 3 has been described with reference to FIGS. 4A to 20, but it may be understood by those of ordinary skill in the art that integrated circuit devices having various structures implemented by modifying and changing the integrated circuit devices 100 and 200 may be manufactured through various modifications and changes within the present disclosure.

While the present disclosure has been particularly shown and described with reference to embodiments thereof, it will be understood that various changes in form and details may be made therein without departing from the spirit and scope of the following claims.

What is claimed is:

1. An integrated circuit device comprising:
   an active region extending in a first horizontal direction on a substrate;
   a gate line extending in a second horizontal direction on the active region, wherein the gate line has a first side and a second side that is opposite to the first side in the first horizontal direction;
   a first transistor at a first vertical level on the active region, the first transistor comprising a first source/drain region having a first conductive type on the first side of the gate line; and
   a second transistor at a second vertical level that is higher than the first vertical level on the active region, the second transistor comprising a second source/drain region having a second conductive type on the first side of the gate line and overlapping the first source/drain region in a vertical direction,
   wherein a maximum width of the first source/drain region in the first horizontal direction is less than a maximum width of the second source/drain region in the first horizontal direction, and
   wherein the first horizontal direction intersects the second horizontal direction.

2. The integrated circuit device of claim 1, wherein a size of the second source/drain region is greater than a size of the first source/drain region.

3. The integrated circuit device of claim 1, wherein:
   the first transistor further comprises a first nano-sheet on the active region and contacting the first source/drain region, and a first sub gate portion of the gate line surrounding the first nano-sheet,
   the second transistor further comprises a second nano-sheet apart from the active region in the vertical direction with the first nano-sheet between the second nano-sheet and the active region, the second nano-sheet contacting the second source/drain region, and a second sub gate portion of the gate line connected to the first sub gate portion of the gate line as one body and surrounding the second nano-sheet, and
   a maximum width of the second nano-sheet is less than a maximum width of the first nano-sheet in the first horizontal direction.

4. The integrated circuit device of claim 1,
wherein the gate line is shared by the first transistor and the second transistor.

5. The integrated circuit device of claim 1, further comprising:
a first nano-sheet on the active region and contacting the first source/drain region; and
a second nano-sheet overlapping the first nano-sheet in the vertical direction and contacting the second source/drain region,
wherein the gate line surrounds the first nano-sheet and the second nano-sheet, wherein the gate line comprises:
a first sub gate portion facing the first source/drain region in the first horizontal direction and at least partially covering the first nano-sheet;
a second sub gate portion facing the second source/drain region in the first horizontal direction and at least partially covering the second nano-sheet; and
a main gate portion connected to the first sub gate portion and the second sub gate portion as one body and at least partially covering a top surface of the second nano-sheet, and
a maximum width of the second sub gate portion is less than a maximum width of the first sub gate portion in the first horizontal direction.

6. The integrated circuit device of claim 1, wherein the first source/drain region comprises a first semiconductor layer doped with an n-type dopant, and
the second source/drain region comprises a second semiconductor layer doped with a p-type dopant.

7. The integrated circuit device of claim 1, further comprising an insulation pattern between the first source/drain region and the second source/drain region,
wherein the first source/drain region and the second source/drain region are apart from each other with the insulation pattern therebetween in the vertical direction.

8. The integrated circuit device of claim 1, further comprising:
a first nano-sheet on the active region and contacting the first source/drain region; and
a second nano-sheet overlapping the first nano-sheet in the vertical direction and contacting the second source/drain region,
wherein the gate line comprises a first sub gate portion surrounding the first nano-sheet and a second sub gate portion surrounding the second nano-sheet, and
wherein:
the first source/drain region comprises a first protrusion portion protruding toward the first sub gate portion to overlap a portion of the first nano-sheet in the vertical direction, and
the second source/drain region comprises a second protrusion portion protruding toward the second sub gate portion to overlap a portion of the second nano-sheet in the vertical direction.

9. An integrated circuit device comprising:
a fin-type active region protruding in a vertical direction from a substrate and extending in a first horizontal direction;
at least one first nano-sheet at a first separation distance in the vertical direction from a top of the fin-type active region;
a plurality of first source/drain regions at both sides of the at least one first nano-sheet, the plurality of first source/drain regions each comprising a first semiconductor material having a first conductive type;
at least one second nano-sheet at a second separation distance that is greater than the first separation distance in the vertical direction from the top of the fin-type active region and overlapping the at least one first nano-sheet in the vertical direction;
a plurality of second source/drain regions at both sides of the at least one second nano-sheet and overlapping the plurality of first source/drain regions in the vertical direction, each of the plurality of second source/drain regions comprising a second semiconductor material having a second conductive type; and
a gate line surrounding the at least one first nano-sheet and the at least one second nano-sheet,
wherein a maximum width of each of the plurality of first source/drain regions in the first horizontal direction differs from a maximum width of each of the plurality of second source/drain regions in the first horizontal direction.

10. The integrated circuit device of claim 9, wherein each of the plurality of first source/drain regions comprise a first semiconductor layer doped with an n-type dopant,
each of the plurality of second source/drain regions comprise a second semiconductor layer doped with a p-type dopant, and
the maximum width of each of the plurality of second source/drain regions is greater than the maximum width of each of the plurality of first source/drain regions.

11. The integrated circuit device of claim 10, wherein
a size of each of the plurality of second source/drain regions is greater than a size of each of the plurality of first source/drain regions.

12. The integrated circuit device of claim 9, wherein the at least one first nano-sheet comprises two first nano-sheets adjacent to each other,
the at least one second nano-sheet comprises two second nano-sheets adjacent to each other,
the gate line comprises a first sub gate portion between the two first nano-sheets and a second sub gate portion between the two second nano-sheets, and
a maximum width of the second sub gate portion is less than a maximum width of the first sub gate portion in the first horizontal direction.

13. The integrated circuit device of claim 9, wherein the at least one first nano-sheet comprises two first nano-sheets adjacent to each other,
the at least one second nano-sheet comprises two second nano-sheets adjacent to each other, and
a separation distance between the at least one first nano-sheet and the at least one second nano-sheet in the vertical direction is greater than a first separation distance between the two first nano-sheets and greater than a second separation distance between the two second nano-sheets.

14. The integrated circuit device of claim 9, wherein a maximum width of the at least one second nano-sheet is less than a maximum width of the at least one first nano-sheet in the first horizontal direction.

15. The integrated circuit device of claim 9, wherein the gate line comprises a first sub gate portion between the plurality of first source/drain regions that at least partially covers the at least one first nano-sheet, and a second sub gate portion between the plurality of second source/drain regions and covering the at least one second nano-sheet, and
each of the plurality of first source/drain regions comprises a first protrusion portion protruding toward the first sub gate portion, and each of the plurality of second source/drain regions comprises a second protrusion portion protruding toward the second sub gate portion.

16. An integrated circuit device comprising:
a fin-type active region extending in a first horizontal direction on a substrate;
a first transistor at a first vertical level on the fin-type active region;
a second transistor at a second vertical level that is higher than the first vertical level on the fin-type active region; and
a gate line shared by the first transistor and the second transistor, wherein the first transistor comprises:
at least one first nano-sheet at a first separation distance in a vertical direction from a top of the fin-type active region and surrounded by the gate line; and
a first source/drain region contacting the at least one first nano-sheet, the first source/drain region comprising an n-type semiconductor material, and
wherein the second transistor comprises:
at least one second nano-sheet at a second separation distance that is greater than the first separation distance in the vertical direction from the top of the fin-type active region, the at least one second nano-sheet overlapping the at least one first nano-sheet in the vertical direction and surrounded by the gate line; and
a second source/drain region contacting the at least one second nano-sheet and having a size greater than a size of the first source/drain region, the second source/drain region comprising a p-type semiconductor material, and
wherein a maximum width of the at least one first nano-sheet is different from a maximum width of the at least one second nano-sheet in the first horizontal direction.

17. The integrated circuit device of claim 16, wherein the gate line comprises:
a first sub gate portion including a first surface facing the at least one first nano-sheet and a second surface facing the first source/drain region, the first sub gate portion having a first maximum width in the first horizontal direction; and
a second sub gate portion including a third surface facing the at least one second nano-sheet and a fourth surface facing the second source/drain region, the second sub gate portion having a second maximum width that is less than the first maximum width in the first horizontal direction.

18. The integrated circuit device of claim 16, wherein the maximum width of the at least one first nano-sheet is greater than the maximum width of the at least one second nano-sheet in the first horizontal direction.

19. The integrated circuit device of claim 16, further comprising an insulation pattern between the first source/drain region and the second source/drain region at a third vertical level between the first vertical level and the second vertical level,
wherein the gate line comprises:
a first sub gate portion at a vertical level that is higher than the top of the fin-type active region and lower than the third vertical level and that at least partially covers the at least one first nano-sheet;
a second sub gate portion at a vertical level that is higher than the third vertical level and that at least partially covers the at least one second nano-sheet; and
a third sub gate portion at the third vertical level, the third sub gate portion including a surface facing the insulation pattern, and
a thickness of the third sub gate portion is greater than a thickness of the first sub gate portion and greater than a thickness of the second sub gate portion in the vertical direction.

* * * * *